(12) United States Patent
Day et al.

(10) Patent No.: US 7,535,936 B2
(45) Date of Patent: May 19, 2009

(54) EXTERNAL CAVITY TUNABLE COMPACT MID-IR LASER

(75) Inventors: Timothy Day, Poway, CA (US); David F. Arnone, Mountain View, CA (US)

(73) Assignee: Daylight Solutions, Inc., Poway, CA (US)

( * ) Notice: Subject to any disclaimer, the term of this patent is extended or adjusted under 35 U.S.C. 154(b) by 184 days.

(21) Appl. No.: 11/198,496

(22) Filed: Aug. 5, 2005

(65) Prior Publication Data

US 2007/0030865 A1 Feb. 8, 2007

(51) Int. Cl.
*H01S 3/10* (2006.01)
(52) U.S. Cl. .............................. 372/20; 372/36; 372/81; 372/101; 372/107
(58) Field of Classification Search ..................... 372/20
See application file for complete search history.

(56) References Cited

U.S. PATENT DOCUMENTS

| | | | | |
|---|---|---|---|---|
| 4,656,641 | A | * | 4/1987 | Scifres et al. ................ 372/103 |
| 5,082,339 | A | * | 1/1992 | Linnebach .................... 385/14 |
| 5,082,799 | A | | 1/1992 | Holmstrom et al. |
| 5,140,599 | A | * | 8/1992 | Trutna et al. .................. 372/20 |
| 5,172,390 | A | | 12/1992 | Mooradian |
| 5,181,214 | A | | 1/1993 | Berger et al. |
| 5,260,822 | A | * | 11/1993 | Missaggia et al. ........... 359/337 |
| 5,331,651 | A | * | 7/1994 | Becker et al. .................. 372/32 |
| 5,457,709 | A | * | 10/1995 | Capasso et al. .......... 372/45.01 |

(Continued)

OTHER PUBLICATIONS

Peltier Coolers—V Rudometov—E Rudometov—Vontage The Broadband Phone Company—www.digit-life.com/article/peltiercollers/ pp. 1-11.

(Continued)

*Primary Examiner*—Minsun Harvey
*Assistant Examiner*—Xnning Niu
(74) *Attorney, Agent, or Firm*—Roeder & Broder LLP

(57) ABSTRACT

A compact mid-IR laser device utilizes an external cavity to tune the laser. The external cavity may employ a Littrow or Littman cavity arrangement. In the Littrow cavity arrangement, a filter, such as a grating, is rotated to provide wavelength gain medium selectivity. In the Littman cavity arrangement, a reflector is rotated to provide tuning. A quantum cascade laser gain medium provides mid-IR frequencies suitable for use in molecular detection by signature absorption spectra. The compact nature of the device is obtained owing to an efficient heat transfer structure, the use of a small diameter aspheric lens for both the output lens and the external cavity lens and a monolithic assembly structure to hold the optical elements in a fixed position relative to one another. The compact housing size may be approximately 20 cm×20 cm×20 cm or less. Efficient heat transfer is achieved using a thermoelectric cooler TEC combined with a high thermal conductivity heat spreader onto which the quantum cascade laser gain medium is thermally coupled. The heat spreader not only serves to dissipate heat and conduct same to the TEC, but also serves as an optical platform to secure the optical elements within the housing in a fixed relationship relative on one another. The small diameter aspheric output and external cavity lens each may have a diameter of 10 mm or less and each lens is positioned to provided a collimated beam output from the quantum cascade laser gain medium. The housing is hermetically sealed to provide a rugged, light weight portable MIR laser source.

32 Claims, 13 Drawing Sheets

U.S. PATENT DOCUMENTS

| | | | | |
|---|---|---|---|---|
| 5,537,432 | A | * | 7/1996 | Mehuys et al. ............ 372/50.11 |
| 5,752,100 | A | * | 5/1998 | Schrock ...................... 396/129 |
| 6,018,535 | A | * | 1/2000 | Maeda ......................... 372/20 |
| 6,243,404 | B1 | * | 6/2001 | Joyce ........................... 372/34 |
| 6,326,646 | B1 | | 12/2001 | Baillargeon et al. |
| 6,483,978 | B1 | * | 11/2002 | Gao et al. .................... 385/135 |
| 6,553,045 | B2 | | 4/2003 | Kaspi |
| 6,575,641 | B2 | | 6/2003 | Yamabayashi et al. |
| 6,636,539 | B2 | | 10/2003 | Martinsen |
| 6,782,162 | B2 | * | 8/2004 | Fukuzawa et al. ............. 385/34 |
| 6,856,717 | B2 | * | 2/2005 | Kilian .......................... 385/15 |
| 6,859,481 | B2 | | 2/2005 | Zheng |
| 7,032,431 | B2 | | 4/2006 | Baum et al. |
| 7,061,022 | B1 | | 6/2006 | Pham et al. |
| 2002/0090013 | A1 | | 7/2002 | Murry et al. |
| 2002/0150133 | A1 | * | 10/2002 | Aikiyo et al. ................. 372/36 |
| 2002/0176473 | A1 | | 11/2002 | Mouradian |
| 2003/0043877 | A1 | | 3/2003 | Kaspi |
| 2003/0095346 | A1 | | 5/2003 | Nasu et al. |
| 2003/0198274 | A1 | | 10/2003 | Lucchetti |
| 2004/0013154 | A1 | | 1/2004 | Zheng |
| 2004/0208602 | A1 | | 10/2004 | Plante |
| 2004/0228371 | A1 | | 11/2004 | Kolodzey et al. |
| 2004/0238811 | A1 | | 12/2004 | Nakamura et al. |
| 2005/0213627 | A1 | | 9/2005 | Masselink et al. |
| 2006/0056466 | A1 | | 3/2006 | Belenky et al. |
| 2007/0291804 | A1 | | 12/2007 | Day et al. |

OTHER PUBLICATIONS

Room-temperature mid-infrared laser sensor for trace gas detection—T Topfer, KP Petrov, Y Mine, D Jundt, RF Curl, and FK Tittel—Applied Optices/ vol. 36. No. 30—Oct. 20, 1997 pp. 8042-8049.

Cavity Enhancing Sensors using QC Lasers—infrared.phl.gov/enhanced.sensors.htm—pp. 1-6.

Transient FM Absorption Spectroscopy—www.chem/tamu.edu/rgroup/north/FM.html—pp. 1 and 2.

FM Spectroscopy With Tunable Diode Lasers—Application Note 7—New Focus Copyright 2001—pp. 1-10.

Frequency Modulation Spectroscopy—J Andrews and P Dallin—www.spectroscopyeurope.com—pp. 24-26.

Tunable infrared laser spectroscopy—RF Curl and FK Tittel—pp. 219-272.

AIAA 2002-0824 Measurments of Trace Pollutants in Combustion Flows Using Room-Temperatur, Mid-IR Quantum Cascade Lasers.—S Wehe, D Sonnenfroh, M Allen (Physical Sciences Inc.) C Gmachl and F Capasso ( Bell Laboratories, Lucent Technologies)—Meeting and Exhibit Jan. 14-17, 2002—cover and pp. 1-7.

Precision MEMS Flexure mount for a Littman tunable external cavity laser—W Huang, RRA Syms, J. Stagg and A. A Lohmann—IEE Prc-Sci Meas. Technol vol. 151, No. 2 Mar. 2004—pp. 67-75.

Quantum cascade external cavity and DFB laser systems in the mid-infrared spectral range; devices and applications—L Hildebrandt, S Stry, R Knispel, JR Sacher, T Beyer, M Braun, A Lambrecht, T Gensty, W Elsaber, Ch. Mann and F. Fuchs—2 pages.

Sensitive absorption spectroscopy with a room-temperature distributed-feedback quantum-cascade laser—K Nanjou, S Cai, EA Whittaker, J Faist, C Gmachl, F Capasso, DL Sivco, and AY Cho.—1998 Optical Society of America—pp. 219-221.

Transient Laser Frequency Modulation Spectroscopy—G E Hall, SW North—Annu Rev. Phys. Chem. 2000, 51:; 243-74—Copyright 2000.

External-cavity quantum-cascade lasers—www.unine.ch/phys/meso/EC/EC.html pp. 1-4.

Thermoelectrically cooled quantum cascade laser based sensor for continuous monitoring of ambient atmospheric CO—AA Koserev, FK Tittel, R Kohler, C Gmachl, F Capasso, DL Sivco, AY Cho, S Wehe and M Allen—Copyright 2002 Optical Society of America—cover and pp. 1-16.

MOEMS Tuning Element for a Littrow External Cavity Laser—Journal of Microelectromechanical Systems, vol. 12, No. 6 Dec. 2003—RA Syms—A Lohmann—pp. 921-928.

Frequency stabilization of diode lasers—Santa Chawla—National Physical Laboratoriy—www.ias.ac.in/currsci/jan25/articles41.htm—pp. 1-17.

S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland.

Gaetano Scamarcio, Mid-IR and THz Quantum Cascade Lasers, 2005, Physics Dept., University of Bari, Bari Italy.

Gaetano Scamarcio et al., Micro-probe characterization of QCLs correlation with optical performance, APL 78, 1177 & APL 78, 2095 (2001), APL 2002, APL 2004, University of Bari, Bari Italy.

Corrie David Farmer, "Fab and Eval. of QCL's", Sep. 2000, Faculty of Engineering, University of Glasgow, Glasgow, UK.

J. Faist, THz and Mid-IR Quantum cascade lasers, QM in space, Chatillon, Mar. 31, Science 2002, University of Neuchatel, EU Projects Answer/Teranova; Agilent, Funding Swiss National Science Foundation.

Joel M. Hensley, Recent Updates in QCL-based Sensing Applications, Sep. 5-10, 2006. Physical Sciences, Inc., Andover, MA, 2nd International Workshop on Quantum Cascade Lasers, Ostuni, Italy.

J.M. Hensley et al., Demonstration of an External Cavity Terahertz Quantum Cascade Laser, Copyright 2005, Optical Society of America, Washington, DC 20036.

L. Hildebrandt et al., Quantum cascade external cavity and DFB laser systems in the mid-infrared spectral range: devices and applications, 2004, Marburg Germany.

Richard Maulini et al., Broadly tunable external cavity quantum-cascade lasers, 2005, University of Neuchatel, Neuchatel Switzerland.

Tsekoun, A. et al; "Improved performance of QCL's through a scalable, manufacturable epitaxial-side-down mounting process"; Feb. 2006.

Pushkarsky, M. et al.; "Sub-parts-per-billion level detection of NO2 using room temp. QCLs"; May 2006.

Wirtz, D. et al.; "A tuneable heterodyne infrared spectrometer"; Physikalisches Institut; University of Koln; Koln Germany Spectrochimica 2002.

Williams, B. et al.;"Terahertz QCLs and Electronics"; PhD-MIT 2003.

Hildebrandt, L.et al.."Quantum cascade external cavity laser systems in the mid-infrared spectral range," 2004, Sacher Lasertechnik Group, Marburg, Germany.

International Preliminary Report on Patentability and Written Opinion for PCT/US06/029975 (related to the present application), publication date Jun. 12, 2008, Daylight Solutions.

* cited by examiner

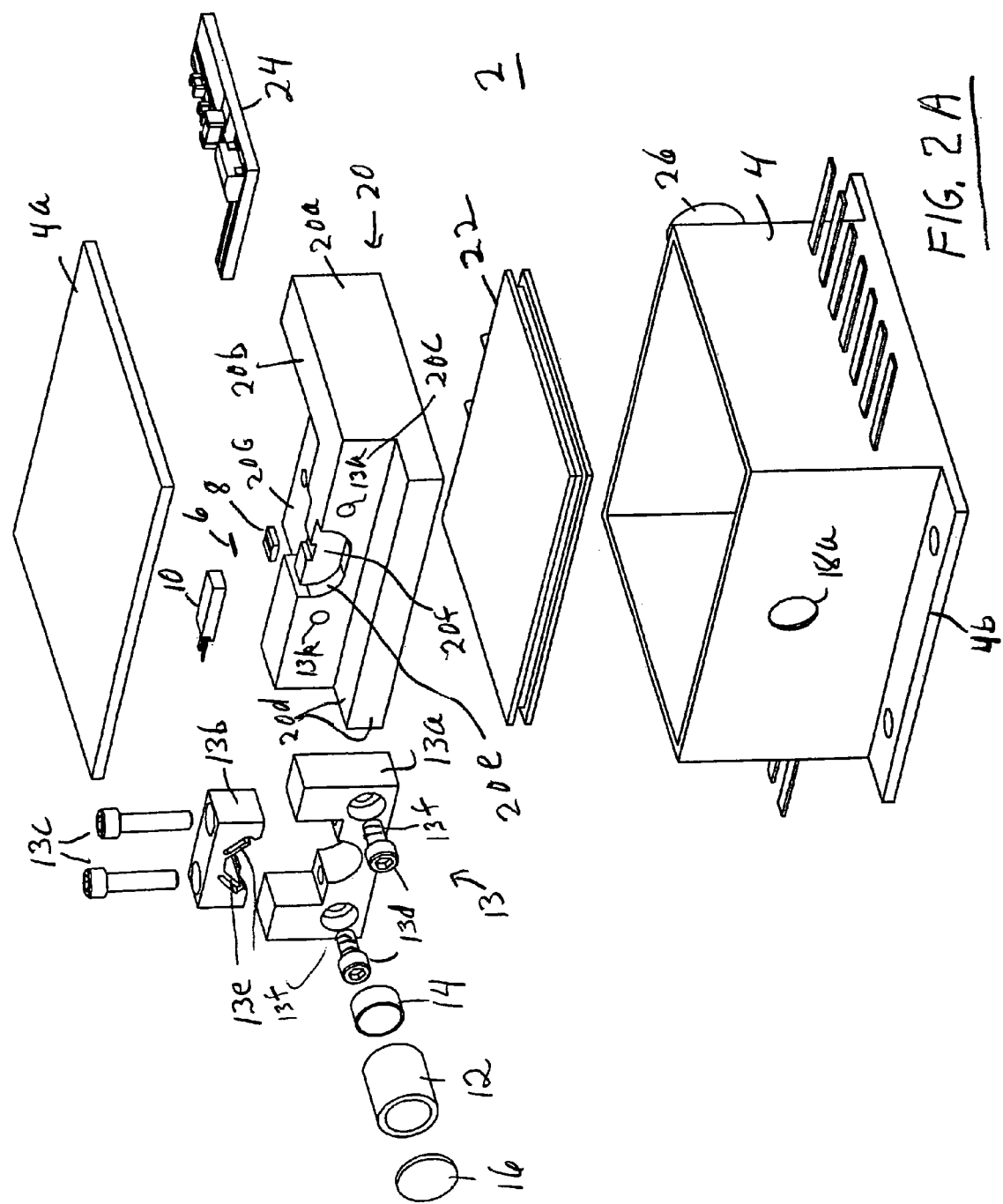

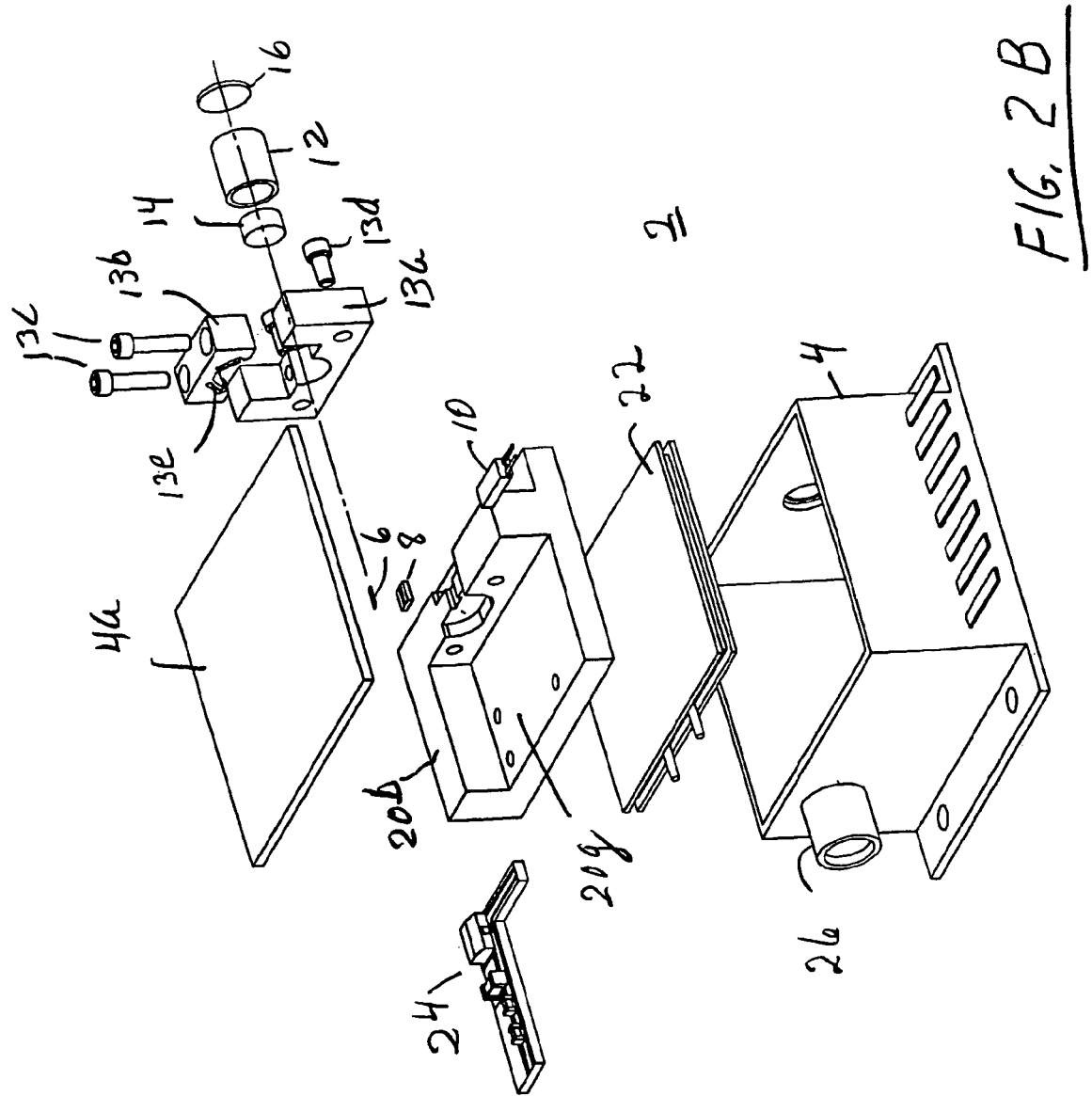

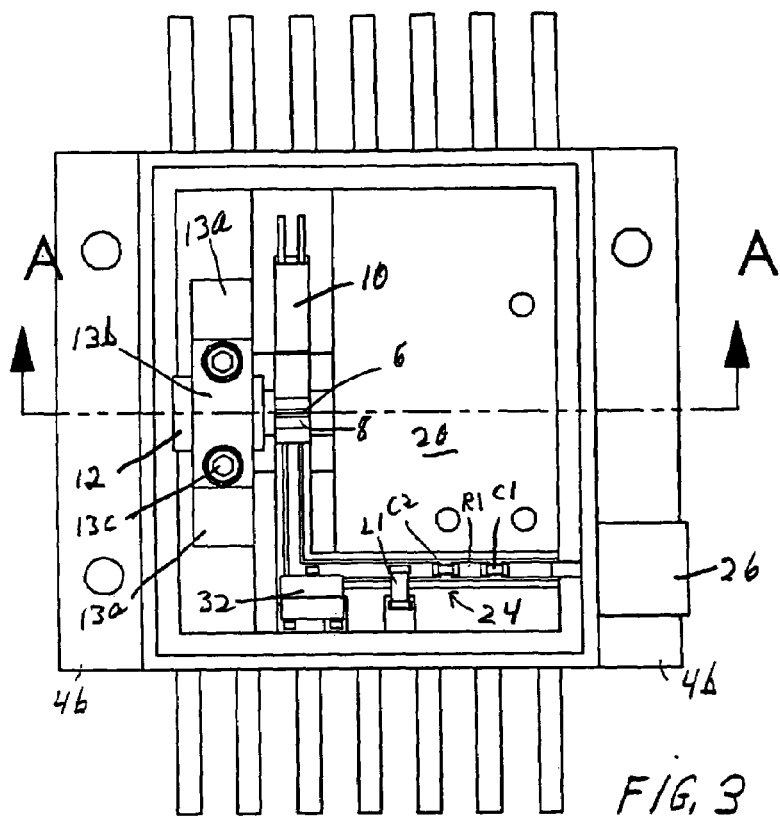
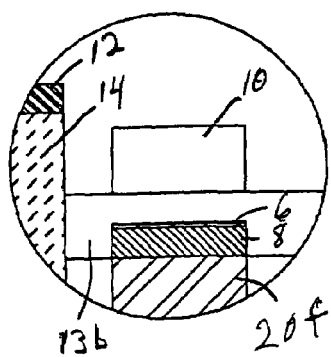
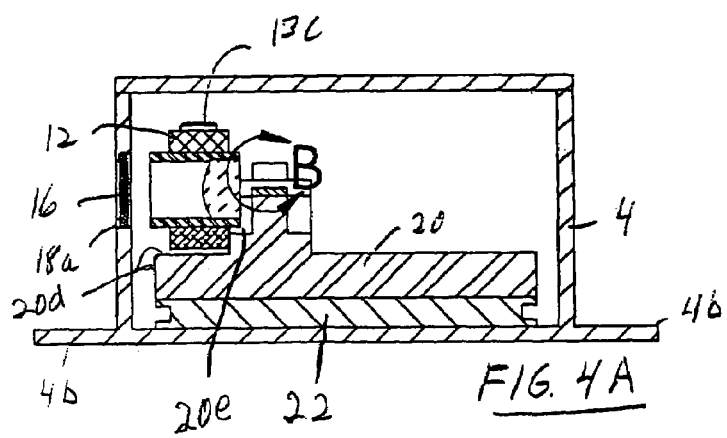

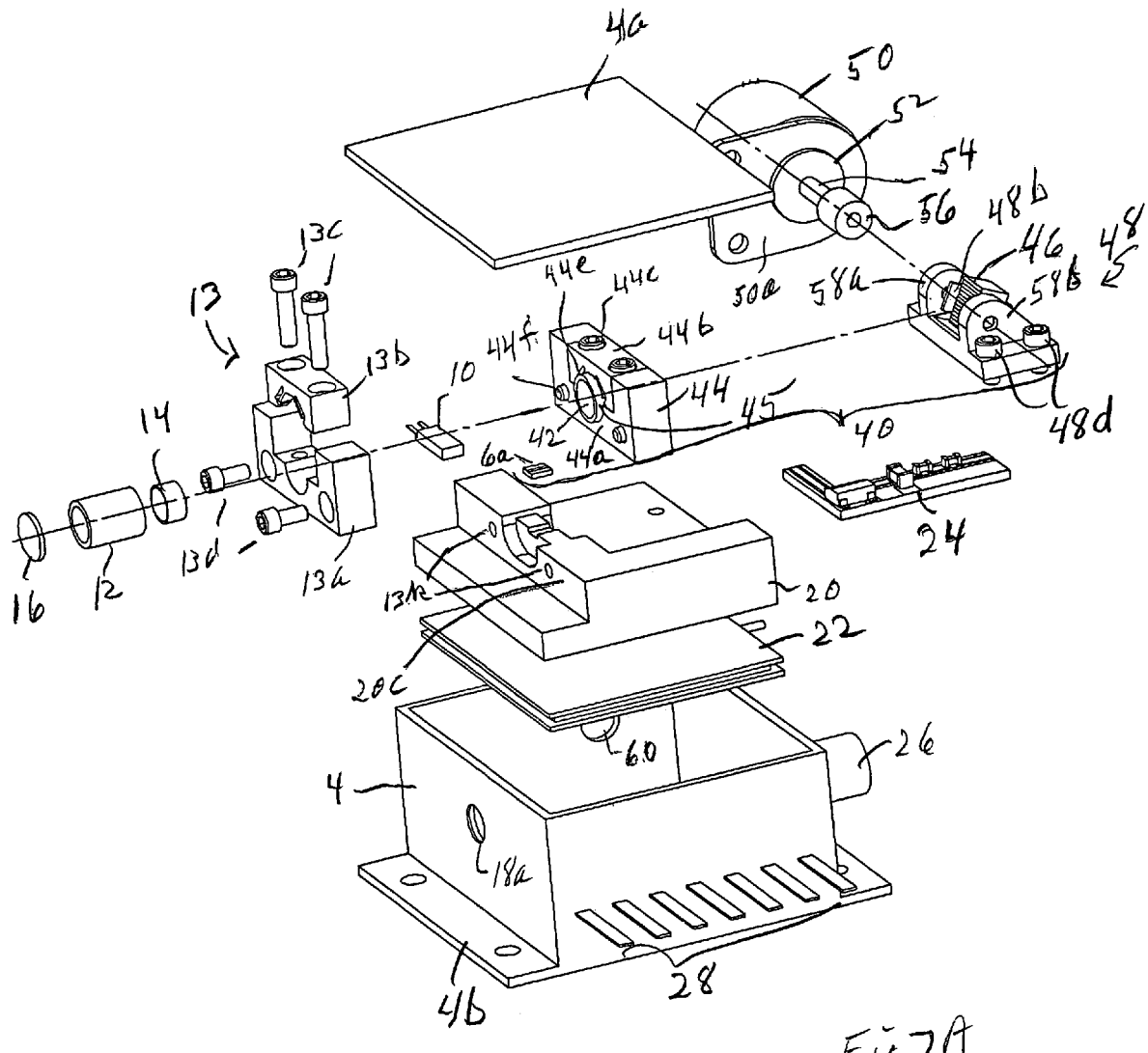

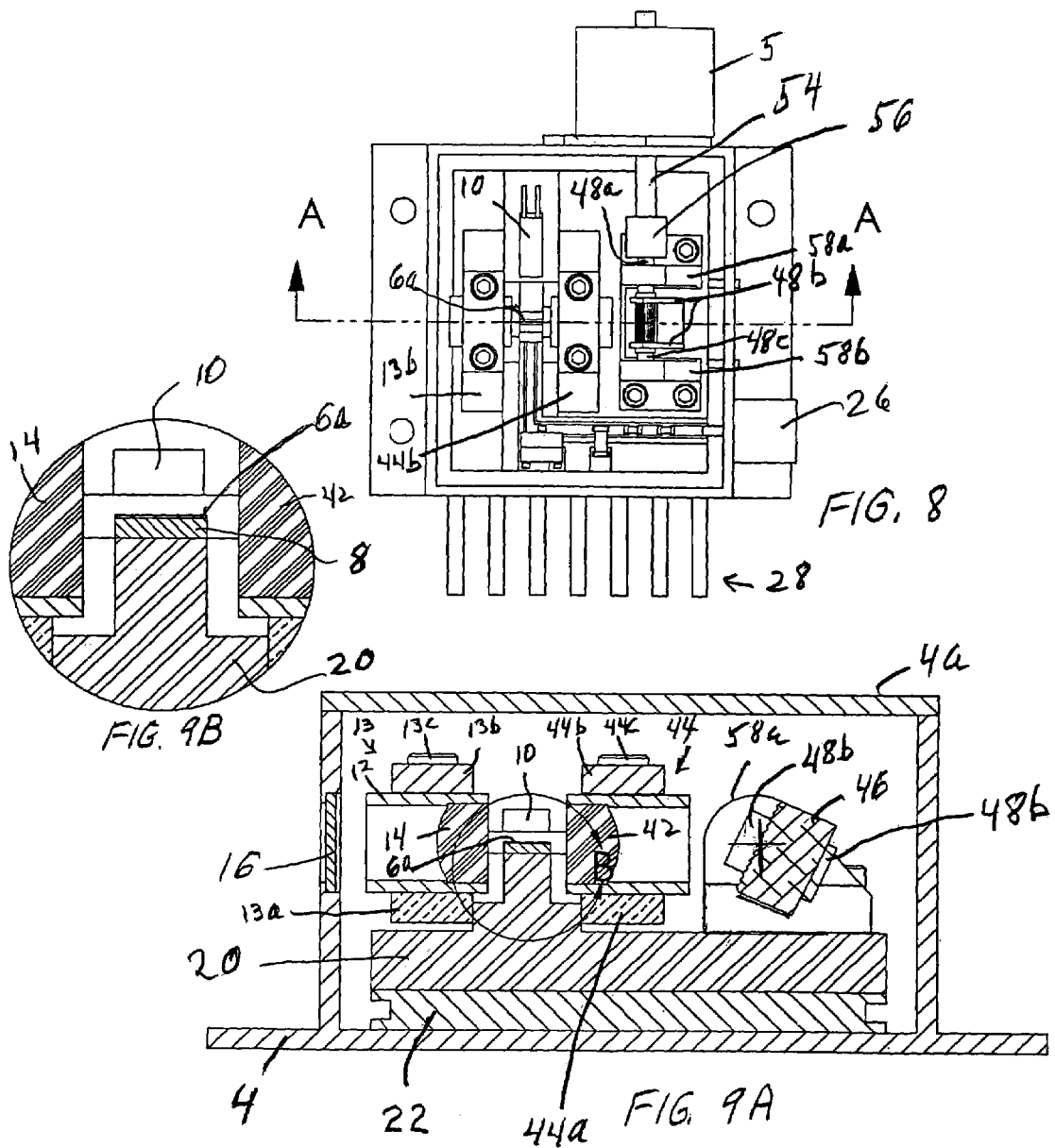

EXTERNAL CAVITY TUNABLE COMPACT MID-IR LASER

BACKGROUND OF THE INVENTION

1. Field of the Invention

Embodiments of the invention relate to a compact Mid-Infrared (MIR) laser device which is tunable utilizing an external cavity. The laser device finds applications in many fields such as, molecular detection and imaging instruments for use in medical diagnostics, pollution monitoring, leak detection, analytical instruments, homeland security and industrial process control. Embodiments of the invention are also applicable to the detection of molecules found in human breath; such molecules correlate to existing health problems such as asthma, kidney disorders and renal failure.

2. Description of Related Art

MIR lasers of interest herein may be defined as lasers having a laser output wavelength in the range of approximately 3-12 $\mu$/m (3333–833 $cm^{-1}$). More broadly, however, "MIR" may be defined as wavelengths within a range of 3-30 $\mu$m. The far-IR is generally considered 30-300 $\mu$m, whereas the near IR is generally considered 0.8 to 3.0 $\mu$m. Such lasers are particularly advantageous for use in absorption spectroscopy applications since many gases of interest have their fundamental vibrational modes in the mid-infrared and thus present strong, unique absorption signatures within the MIR range.

Various proposed applications of MIR lasers have been demonstrated in laboratories on bench top apparatuses. Actual application of MIR lasers has been more limited and hampered by bulky size and cost of these devices.

One laser gain medium particularly useful for MIR lasers is found in the quantum cascade laser (QCL). Such lasers are commercially available and are advantageous in that they have a relatively high output intensity and may be fabricated to provide wavelength outputs throughout the MIR spectrum. QCL have been shown to operate between 3.44 and 84 $\mu$m and commercial QCL are available having wavelengths in the range of 5 to 11 $\mu$m. The QCL utilized two different semiconductor materials such as InGaAs and AlInAs (grown on an InP or GaSb substrate for example) to form a series of potential wells and barriers for electron transitions. The thickness of these wells/barriers determines the wavelength characteristic of the laser. Fabricating QCL devices of different thickness enables production of MIR laser having different output frequencies. Fine tuning of the QCL wavelength may be achieved by controlling the temperature of the active layer, such as by changing the DC bias current. Such temperature tuning is relatively narrow and may be used to vary the wavelength by approximately 0.27 nm/Kelvin which is typically less than 1% of the of peak emission wavelength.

The QCL, sometimes referred to as Type I Cascade Laser or Quantum Cascade Laser, may be defined as a unipolar semiconductor laser based on intersubband transitions in quantum wells. The QCL, invented in 1994, introduced the concept of "recycling" each electron to produce more than one photon per electron. This reduction in drive current and reduction in ohmic heating is accomplished by stacking up multiple "diode" regions in the growth direction. In the case of the QCL, the "diode" has been replaced by a conduction band quantum well. Electrons are injected into the upper quantum well state and collected from the lower state using a superlattice structure. The upper and lower states are both within the conduction band. Replacing the diode with a single-carrier quantum well system means that the generated photon energy is no longer tied to the material bandgap. This removes the requirement for exotic new materials for each wavelength, and also removes Auger recombination as a problem issue in the active region. The superlattice and quantum well can be designed to provide lasing at almost any. photon energy that is sufficiently below the conduction band quantum well barrier.

Another type of Cascade Laser is the Interband Cascade Laser (ICL) invented in 1997. The ICL, sometimes referred to as a Type II QCL (Cascade Laser), uses a conduction-band to valence-band transition as in the traditional diode laser, but takes full advantage of the QCL "recycling" concept. Shorter wavelengths are achievable with the ICL than with QCL since the transition energy is not limited to the depth of a single-band quantum well. Thus, the conduction band to valance band transitions of the Type II QCLs provide higher energy transitions than the intra-conduction band transitions of the Type I QCLs. Typical wavelengths available with the Type II QCL are in the range of 3-4.5 $\mu$m, while the wavelengths for the Type I QCLs generally fall within the range of 5-20 $\mu$m. While Type II QCLs have demonstrated room temperature CW operation between 3.3 and 4.2 $\mu$m, they are still limited by Auger recombination. Clever bandgap engineering has substantially reduced the recombination rates by removing the combinations of initial and final states required for an Auger transition, but dramatic increases are still seen with active region temperature. It is expected that over time improvements will be made to the ICL in order to achieve the desired operating temperature range and level of reliability.

For purposes of the present invention, QCL and ICL may be referred to under the generic terminology of a "quantum cascade laser" or "quantum cascade laser device". The laser gain medium referred to herein thus generally refers to a quantum cascade laser in the context of the fixed wavelength embodiments. When the quantum cascade laser is utilized in a tunable external cavity arrangement as described in other embodiments herein, one of the mirror facets of the quantum cascade laser, which in the fixed wavelength embodiments serves as a partially reflecting mirror, is replaced with an anti-reflective coating so that the laser light is passed to the external cavity and impinges upon a wavelength dependent filter. This wavelength dependent filter is used to feed back to the laser gain medium a narrow band wavelength which is then preferentially amplified in the laser gain medium. In this manner, the laser output may be tuned to a desired wavelength within a range around the nominal center wavelength of the quantum cascade laser. Thus, when the quantum cascade laser is used in an external cavity arrangement, it is more accurate to refer to the lasing device as a quantum cascade laser gain medium or simply as the laser gain medium since the external cavity and not the facet mirror of the laser chip itself dictates what wavelength will experience the most gain and thus dominate the laser output.

For the purposes of the present invention, the term "subband" refers to a plurality of quantum-confined states in nano-structures which are characterized by the same main quantum number. In a conventional quantum-well, the subband is formed by each sort of confined carriers by variation of the momentum for motion in an unconfined direction with no change of the quantum number describing the motion in the confined direction. Certainly, all states within the subband belong to one energy band of the solid: conduction band or valence band.

For the purposes of the present invention, the term "nanostructure" refers to semiconductor (solid-state) electronic structures including objects with characteristic size of the nanometer ($10^{-9}$) scale. This scale is convenient to deal with quantum wells, wires and dots containing many real atoms or atomic planes inside, but being still in the size range that should be treated in terms of the quantum mechanics.

For the purposes of the present invention term "unipolar device" refers to devices having layers of the same conductivity type, and, therefore, devices in which no p-n junctions are a necessary component.

The development of small MIR laser devices has been hampered by the need to cryogenically cool the MIR lasers (utilizing, for example, a large liquid nitrogen supply) and by the relatively large size of such devices hampering their portability and facility of use and thus limiting their applicability.

A fixed wavelength MIR laser device is described in co-pending application Ser. No. 11/154,264, filed Jun. 15, 2005, and incorporated herein by reference. The discussion of the prior application is made for convenience in the Background section of the specification and no admission of such disclosure as being prior art is made thereby. In the fixed wavelength device, the laser is tunable to a small degree by change in temperature of the laser gain medium either by external temperature control or by variation of the input current to the quantum cascade laser. Thus, while such laser devices are generally referred to as "fixed" wavelength, it is understood by those skilled in the art that a relatively small variation of wavelength is nevertheless available, typically less than 1% of the peak wavelength, by means of temperature control.

As disclosed in the co-pending application, FIG. 1A shows FIGS. 1A-1C show perspective views of a MIR laser device 2. FIG. 1A shows the MIR laser device 2 with the housing 4 including the lid or top cover plate 4a and mounting flanges 4b. FIGS. 1B and 1C show the MIR laser device 2 with the lid 4a removed, thus exposing the interior components. FIGS. 2A and 2B show exploded perspective, views of the various components of the MIR laser. FIGS. 3 and 4A show plan and side views respectively of the laser device and FIG. 4B shows an enlarged portion of FIG. 4A.

As may be seen from these figures, the MIR laser device is seen to include a laser gain medium 6 mounted on a high thermal conductivity sub-mount 8. There is further provided a temperature sensor 10, a lens holder 12, output lens mount 13, output lens 14, and window 16. An output aperture 18a is provided in the side of the housing 4 with the window positioned therein. The MIR laser device is also comprised a heat spreader 20, cooler 22 and electronics sub-assembly 24. The heat spreader 20 also serves as the optical platform to which the key optical elements of the laser device are secured. Thus, more precisely, element 20 may be referred to as the heat spreader/optical platform and this composite term is sometimes used herein. However, for simplicity, element 20 may be referred to as a "heat spreader" when the heat transfer function is of interest and as an "optical platform" when the platform features are of interest. The housing 4 is also provided with an RF input port 26 and a plurality of I/O leads 28 which connect to the electronic sub-assembly 24 and temperature sensor 10. These leads may extend out of one or both sides of the housing.

The output lens mount 13, especially as seen in FIGS. 2A and 2B, is seen to comprise a U-shaped support 13a, a retention cap 13b, top screws 13c and front screws 13d. The lens 14 is secured within the lens holder 12 as for example by means of glue or solder. The lens holder 12 in turn is secured within the output lens mount 13 and specifically between the lens U-shaped support 13a and the retention cap 13b. Spring fingers 13e secured to the retention cap 13b make pressure contact with the top portions of the lens holder 12 when the top screws 13c, which are threaded, are tightened down into mating threaded holes in U-shaped support 13a, to secure the retention cap 13b to the U-shaped support 13a. The front screws 13d secure the U-shaped support 13a to the optical platform 20 via threaded portions 13f screwed into threaded holes 13k within the front surface 20c of the heat spreader/optical platform 20. In this manner, the output lens mount 13, (and consequently the lens 14 itself) is rigidly and fixedly secured to the optical platform 20.

The laser gain medium 6 is preferably a quantum cascade laser, either QCL or ICL) which has the advantages providing tunable MIR wavelengths with a small size and relatively high output intensity. Examples of such a laser include 3.7 μm and 9.0 μm laser manufactured by Maxion. These quantum cascade lasers have partially reflecting and fully reflecting mirrors formed by the end facets of the laser gain material. The laser gain medium 6 typically has a size of 2 mm×0.5 mm×90 microns and is mounted directly to the high thermal conductivity submount 8 utilizing an adhesive or weld or other suitable method of securing same. The high thermal conductivity sub-mount 8 is preferably made of industrial grade diamond and may have representative dimensions of 2 mm high×2 mm wide×0.5 mm long (length along the beam path). An alternative dimension may be 8 mm high×4 mm wide by 2 mm long. Other materials may also be used as long as they have a sufficiently high thermal conductivity sufficient to conduct heat from the laser gain medium 6 to the larger heat spreader 20. The thermal conductivity is preferably in the range of 500-2000 W/mK and preferably in the range of approximately 1500-2000 W/mK. In alternative embodiments, the high thermal conductivity submount 8 may be made of a layer of diamond mounted on top of a substrate of another high thermal conductive material such as Cu or CuW. For example, the overall dimensions of the submount may be 8 mm high×4 mm wide×2 mm long (length along the beam path), and it may be composed of a diamond portion of a size 0.5 mm high×2 mm wide×2 mm long with the remaining portion having a size of 7.5 mm high×2 mm wide×2 mm long and composed, for example, of Cu or CuW. In a most preferred embodiment, the size of the housing is 3 cm (height)×4 cm (width)×6 cm (length) where the length is taken along the direction of beam propagation (optical axis) and includes the two mounting flanges 4b on each end of the housing 4.

The heat spreader 20 may be fabricated from copper-tungsten or other material having a sufficiently high thermal conductivity to effectively spread out the heat received from the high thermal conductivity sub-mount 8. Moreover heat spreader may be composed of a multilayer structure of high thermal conductivity. The high thermal conductivity sub-mount 8 may be secured to the heat spreader 20 by means of epoxy, solder, or laser welded.

The heat spreader 20 is placed in direct thermal contact with the cooler 22 which may take the form of a thermoelectric cooler (TEC) which provides cooling based on, for example, the Peltier effect. The TEC may also be fabricated from thermionic coolers or microcoolers, made from, for example, silicon germanium. As best seen in FIG. 4, the cooler 22 is placed in direct thermal contact with the bottom wall of the housing 4 and transfers heat thereto. The bottom surface of the heat spreader 20 may be secured to the top surface of the cooler 22 by means of epoxy, welding, solder or other suitable means. Alternatively, an intermediate plate may be attached between the top surface of the cooler 22 and the bottom surface of the heat spreader 20 in order to provide further rigidity for the optical platform function of the heat spreader 20. This intermediate plate may serve as a substrate on which the heat spreader is mounted. If the intermediate plate is not utilized, then the top surface of the TEC heat cooler 22 serves as the substrate for mounting the heat spreader 20.

The laser device 2 may have its housing mounted to a heat sink (not shown) inside a larger housing (not shown) which may also contain additional equipment including cooling fans and vents to further remove the heat generated by the operation of the laser.

The cooler 22 is driven in response to the temperature sensor 10. The cooler may be driven to effect cooling or heating depending on the polarity of the drive current thereto. Currents up to 10-A may be required to achieve temperature stability in CW operation, with less required in pulsed operation. Temperature variations may be used to effect a relatively small wavelength tuning range on the order 1% or less.

The lens 14 may comprise an aspherical lens with a diameter approximately equal to or less than 10 mm and preferably approximately equal to or less than 5 mm. Thus, the focal length may be one of approximately 1, 2, 3, 4, 5, 6, 7, 8, 9, 10, 11, 12, 13, 14, 15, 16, 17, 18, 19, or 20 mm and any fractional values thereof. The focal length of the lens 14 is fabricated to be approximately ½ the size of the diameter. Thus, 10 mm diameter lens will have a focal length of approximately 5 mm, and a 5 mm diameter lens will have a focal length of approximately 2.5 mm. In practice, the lens focal length is larger than ½ the diameter as discussed below in connection with the numeric aperture. The lens 14 serves as a collimating lens and is thus positioned a distance from the laser gain medium 6 equal to its focal length. The collimating lens serves to capture the divergent light from the laser gain medium and form a collimated beam to pass through the window 16 to outside the housing 4. The diameter of the lens is selected to achieve a desired small sized and to be able to capture the light from the laser gain medium which has a spot size of approximately 4 µm×8 µm.

The lens 14 may comprise materials selected from the group of Ge, ZnSe, ZnS Si, CaF, BaF or chalcogenide glass. However, other materials may also be utilized. The lens may be made using a diamond turning or molding technique. The lens is designed to have a relatively large numerical aperture (NA) of approximately of 0.6. Preferably the NA is 0.6 or larger. More preferably, the NA is approximately 0.7. Most preferably, the NA is approximately 0.8 or greater. To first order the NA may be approximated by the lens diameter divided by twice the focal length. Thus, selecting a lens diameter of 5 mm with a NA of 0.8 means that the focal length would be approximately 3.1 mm. The lens 14 has an aspheric design so as to achieve diffraction limited performance within the laser cavity. The diffraction limited performance and ray tracing within the cavity permits selection of lens final parameters dependent on the choice of lens material.

The small focal length of the lens is important in order to realize a small overall footprint of the laser device 2. Other factors contributing to the small footprint include the monolithic design of the various elements, particularly as related to the positioning of the optical components and the ability to efficiently remove the large amount of heat from the QCL serving as the laser gain medium 6.

The monolithic advantages of the described embodiments result from utilizing the heat spreader/optical platform 20 as an optical platform. The output lens 14 and laser gain medium 6 are held in a secured, fixed and rigid relationship to one another by virtue of being fixed to the optical platform 20. Moreover, the electronic subassembly is also fixed to the optical platform 20 so that all of the critical components within the housing are rigidly and fixedly held together in a stable manner so as to maintain their relative positions with respect to one another. Even the cooler 22 is fixed to the same optical platform 20. Since the cooler 22 takes the form of a thermoelectric cooler having a rigid top plate mounted to the underside of the optical platform 20, the optical platform 20 thereby gains further rigidity and stability. The thermoelectric cooler top plate is moreover of approximately the same size as the bottom surface of the heat spreader/optical platform 20 thus distributing the heat over the entire top surface of the cooler 22 and simultaneously maximizing the support for the optical platform 20.

The heat spreader/optical platform 20 is seen to comprise a side 20a, a top surface 20b, a front surface 20c, a step 20d, a recess 20e and bridge portion 20f and a heat distributing portion 20g. The electronic subassembly 24 is secured to the top surface 20b. The laser gain medium 6 may be directly secured to the bridge portion 20f. If an intermediate high thermal conductivity submount 8 is used between the laser gain medium 6 and the bridge portion 20f, the submount 8 is directly mounted to the bridge portion 20f and the laser gain medium 6 is secured to the submount 8. The output lens mount is secured to the front surface of the optical platform 20 via the front screws 13d. As best seen in FIG. 4A, a portion of the lens holder 12 is received within the recess 20e. It may further be seen that the surface of the lens 14 proximate the laser gain medium 6 is also contained within the recess 20e. Such an arrangement permits the lens, with its extremely short focal length, to be positioned a distance away from the laser gain medium 6 equal to its focal length so that the lens 14 may serve as a collimating lens. The remaining portions of the lens 14 and the lens holder 12 not received within the recess 20e are positioned over the top surface of the step 20d. The heat distributing surface 20g of the heat spreader/optical platform 20 is seen to comprise a flat rigid plate that extends substantially over the entire upper surface of the thermo electric cooler 22. Other than the screw attachments, the elements such as the temperature sensor 10, laser gain medium 6, high thermal conductivity submount 8 and electronics subassembly 24 may be mounted to the heat spreader/optical platform 20 by means of solder, welding, epoxy, glue or other suitable means. The heat spreader/optical platform 20 is preferably made from a single, integral piece of high thermal conductivity material such as a Cu or CuW alloy as non-limiting examples.

The housing 4 is hermetically sealed and for this purpose the lid 4a may incorporate an "O" ring or other suitable sealing component and may be secured to the housing side walls in an air tight manner, e.g., weld or solder. Prior to sealing or closure, a nitrogen or an air/nitrogen mixture is placed in the housing to keep out moisture and humidity. The window 16 and RF input port 26 present air tight seals.

The temperature sensor 10 may comprise an encapsulated integrated circuit with a thermistor as the temperature sensor active component. A suitable such sensor is model AD 590 from Analog Devices. The temperature sensor 10 is positioned on the heat spreader 20 immediately adjacent the laser gain medium 6 and is effective to measure the temperature of the laser gain medium 6. As best seen in FIGS. 1C and 2A the temperature sensor 10 as well as the laser gain medium 6 are in direct thermal contact with the heat spreader 20. The temperature sensor 10 is in direct physical and thermal contact with the heat spreader 20. In one embodiment, the laser gain medium 6 is in direct physical and thermal contact with the high thermal conductivity submount 8. However, in other embodiments, the high thermal conductivity submount 8 may be eliminated and the laser gain medium 6 may be secured in direct physical and thermal contact with the heat spreader 20 with all other elements of the laser device remaining the same. The temperature sensor 10 is connected to the I/O leads 28. The temperature output is used to control the temperature of the cooler 22 so as to maintain the desired level of heat removal from the laser gain medium 6. It may also be used to regulate and control the injection current to the laser gain medium 6 which also provides a temperature adjustment mechanism. Varying the temperature of the laser gain medium 6 serves to tune the laser, e.g., vary the output wavelength.

The electronic sub-assembly 24 is used to control the laser gain medium 6 by controlling the electron injection current. This control is done by using a constant current source. In effect the quantum cascade laser behaves like a diode and exhibits a typical diode I-V response curve. For example, at and above the threshold current, the output voltage is clamped to about 9 volts.

FIG. 5 shows a schematic diagram of the electronics subassembly 24. The electronics subassembly is seen to comprise capacitors C1 and C2, resistor R1, inductor L1, a summing node 30, switch 32, and leads 28a and 28b. A trace or transmission line 34a, 34b (see also FIG. 3) interconnects components. The polarities of the electronics subassembly 24 are selected for a chip arrangement in which the epitaxial layer of the quantum cascade laser is positioned downwardly. Polarities would be reversed if the epitaxial layer side is positioned upwardly.

The RF input port 26 is seen to be fed along the transmission line 34a to one side of the first capacitor C1. Resistor R1, which may comprise a thin film resistor, is positioned between capacitors C1 and C2 and connects the junction of these capacitors to ground. The capacitors and resistor implement an impedance matching circuit to match the low impedance of the quantum cascade laser with the 50 ohm input impedance line of the RF input cable. Transmission line 34b interconnects inductor L1 with the switch 32 and connects to the laser gain medium 6. The inductor L1 is fed by a constant current source (not shown) via one of the I/O leads, here identified as lead 28a. Inductor L1 serves to block the RF from conducting out of the housing through the current lead 28a. Similarly, a function of the capacitor C2 is to prevent the DC constant current form exiting the housing via the RF port 26. The switch 32 may take the form of a MOSFET and is biased by a switching control signal (TTL logic) fed to I/O lead 28b. Controlling the duty cycle of this switching control signal controls the relative on/off time of the MOSFET which is operative to pass the drive current either to the laser gain medium 6 (when the MOSFET is off) or to shunt the drive current to ground (when the MOSFET is on). With TTL logic in the illustrated circuit, a 0 volt switching control signal turns MOSFET off and thus the quantum cascade laser on, and a −5 volt switching control signal turns the MOSFET on and thus the quantum cascade laser off. By controlling the switching control signal duty cycle, pulse or cw operation may be realized.

An RF input signal is fed to the RF input port 26. This RF signal is used to frequency modulate the drive current signal to the laser gain medium 6 and is summed with the drive current at the summing node 30. Frequency modulation is commonly used to improve sensitivity in absorption spectroscopy. The center frequency is scanned across the expected resonance (using, for example, temperature tuning achieved by variation of the TEC cooler 22 or variation of the current fed to the quantum cascade laser). Frequency modulation places sidebands about the center frequency, and during the wavelength scanning a strong RF modulation may be observed when off resonance due to an imbalance in the absorption of the frequency sidebands. FM modulation thus effectively produces an AM modulation of the absorption signal. However, at resonance, the effect of the frequency sidebands is of opposite phase and equal magnitude so they cancel out. Sweeping the frequency about the resonance peak (dip) using FM modulation thus permits one to pinpoint more accurately the center of the absorption line which corresponds to a minimum in the AM modulation over the sweep range. Techniques for FM modulation are well known to those skilled in the art and reference is made to the following articles incorporated herein by reference: *Transient Laser Frequency Modulation Spectroscopy* by Hall and North, Annu Rev. Phys. Chem. 2000 51:243-74.

The quantum cascade lasers utilized herein have an intrinsically high speed. Thus, to effectively perform FM modulation, the modulated signal must be injected in close proximity to the quantum cascade laser to eliminate any excess inductance or capacitances associated with the laser connections to the RF signal. This is especially important in quantum cascade lasers which present a fairly low impedance and thus the reactance of the connections will critically limit the speed with which the device can be modulated. The circuit design as disclosed herein presents an extremely small footprint for connections of the RF input to the quantum cascade laser. Thus, for a 1 GHz modulation frequency, a representative range of transmission lengths from the RF input port 26 to the laser gain medium (QCL) (the sum of 34a and 34b) is 2-4 cm or less generally less than or equal to 4 cm. A preferred value is approximately 3 cm. If one desires to choose a broadband input for the FM modulation restricting the maximum frequency to 1 GHz, then the optimal transmission length is approximately 1 cm or greater. Such a transmission length would permit operating at 100 MHz for example or other values up to the 1 GHz level. Thus, in performing FM modulation of the quantum cascade laser a small transmission path is optimal in order to present a low inductance path to the QCL thereby permitting relatively high modulating frequency to be used. The small transmission paths may be suitably contained with the structures of the disclosed electronic subassembly 24.

It is noted that the entire electronic subassembly 24 is rigidly and fixedly mounted on the heat spreader 20 which serves, as indicated above as an optical platform. The fixing of the transmission lines and other electronic components to the optical platform achieves a rugged design which is largely insensitive to outside vibrational disturbances.

The input leads 28 are seen to comprise leads 28a and 28b and the RF input port 26 described above. Other I/O leads to the housing 4 include the + temp drive signal lead for the TEC to cause the TEC to be heated, a − temp drive signal lead to cause the TEC to be cooled, the temperature sensor input lead to provide a bias voltage to the thermistor temperature sensor, a temperature output lead to provided an output signal for the temperature sensor and a ground return path for the constant current input to the quantum cascade laser.

SUMMARY OF THE INVENTION

In accordance with embodiments of the invention, there is provided an external cavity tunable MIR laser device having a monolithic design to permit the component parts thereof to be fixedly secured to a rigid optical platform so as to provide a highly portable rugged device. The MIR laser has a housing; a thermo electric cooling (TEC) device contained within the housing; a heat spreader contained within the housing and positioned either above a surface of the TEC. The heat spreader may be positioned directly above the surface of the TEC or may be positioned above an intermediate plate which is positioned between the surface of the TEC and the heat spreader. The MIR laser has a quantum cascade laser gain medium contained within the housing and fixedly coupled to the heat spreader; and an output lens contained within the housing and fixedly mounted to the heat spreader for collimating light output from the quantum cascade laser gain medium and directing the collimated light to the exterior of the housing. There is also provided a filter, such as a grating, and a filter support such as a grating support. The filter is mounted to the heat spreader and is operative for selecting one of a plurality of wavelengths from the quantum cascade laser gain medium and feeding back the selected wavelength to the quantum cascade laser gain medium. A filter lens is fixedly mounted to the heat spreader for collimating light output from the quantum cascade laser gain medium and directing same to the filter. The heat spreader serves to distribute heat to the TEC device and also serves as an optical platform to fixedly position the quantum cascade laser gain medium, the output lens, the filter lens and the filer relative to one another.

The TEC device provides cooling by means of, for example, the well known Peltier effect in which a change in temperature at the junction of two different metals is produced when an electric current flows through the junction. Of particular importance herein, there is no need for bulky and costly cryogenic equipment since liquid nitrogen is not utilized to effect cooling. The TEC device is used to cool the quantum cascade laser gain medium in a manner to permit it to stably operate for useful lifetimes in the application of interest without cryogenic cooling.

In one embodiment of the invention, the top surface of the TEC device serves as a substrate onto which is mounted the heat spreader. The heat spreader is effective to spread the heat by thermal conduction across the upper surface of the TEC device to efficiently distribute the heat from the quantum cascade laser gain medium to the TEC device for cooling. In preferred embodiments of the invention, the heat spreader has a high thermal conductivity such as a thermal conductivity within the range of approximately 150-400 W/mK and more preferably in the range of approximately 220-250 W/mK. The latter range includes high copper content copper-tungstens. An example of a suitable high conductivity material is copper tungsten (CuW), typically a CuW alloy or Cu. In accordance with other embodiments of the invention, a high thermal conductivity sub-mount is employed intermediate the quantum cascade laser gain medium and the heat spreader. By way of example, and not by way of limitation, the high thermal conductivity sub-mount may comprise industrial commercial grade diamond throughout its entirety or may be partially composed of such diamond. Diamond is a material of choice due to its extremely high thermal conductivity. In alternative embodiments, the high thermal conductivity sub-mount may be composed of a diamond top section in direct contact and a lower section of a different high thermal conductivity material, such as, for example, Cu or CuW.

In other preferred embodiments, the heat spreader serves as an optical platform onto which the quantum cascade laser gain medium, the output lens, the filter lens, and the filter are fixedly secured. The optical platform is as a rigid platform to maintain the relative positions of the two lens, the filter (e.g., grating) and quantum cascade laser gain medium which are secured thereto (either directly or indirectly). The use of the heat spreading function and the optical platform function into a single material structure contributes to the small size and portability of the MIR laser device.

The quantum cascade laser gain medium is the laser gain medium of preference in accordance with embodiments of the invention and provides the desired mid-IR frequencies of interest. The quantum cascade laser gain medium may be implemented using one of the Type I or Type II lasers described above. The partially reflective facet positioned towards the external cavity that would normally serve as a partially reflective mirror is replaced by an anti-reflecting coating so that light from the laser gain medium passes therethrough to the external cavity wavelength dependent filter e.g., grating. Such a laser generates a relatively strong output IR beam but also generates quite a bit of heat, on the order of 10 W. Thus, the TEC device is an important component needed to remove the heat thereby permitting long lived operation of the quantum cascade laser gain medium.

The output lens is positioned such as to collimate the laser output of the quantum cascade laser gain medium to provide a collimated output beam directed outside of the housing. For this purpose, the quantum cascade laser gain medium is positioned a distance away from the output lens equal to the focal length of the output lens. In this manner, the source of light from the quantum cascade laser gain medium is collected and sent out as an approximately parallel beam of light to the outside of the housing. Similarly, the filter lens (e.g., grating lens) is positioned such as to collimate the laser output of the quantum cascade laser gain medium to provide a collimated output beam directed to the external cavity. For this purpose, the quantum cascade laser gain medium is positioned a distance away from the filter lens equal to the focal length of the filter lens. In this manner, the source of light from the quantum cascade laser gain medium is collected and sent out as an approximately parallel beam of light to the filter within the external cavity.

As known by those skilled in the art, the term "external cavity" is utilized to designate a filter (e.g., grating) structure positioned outside of the semiconductor material forming the quantum cascade laser gain medium itself. The "external cavity" is not external to the housing in which the quantum cascade laser gain medium and the output lens are contained. Indeed, the external cavity is contained within the housing as seen by the various embodiments described in the Detailed Description of Preferred Embodiments set forth below. Moreover, consistent with conventional terminology, the quantum cascade laser gain medium itself is considered to be part of the external cavity.

Preferably, in accordance with embodiments of the invention, the overall size of the housing is quite small to permit facile portability of the MIR laser device, and for this purpose, the housing may have dimensions of approximately 20 cm×20 cm×20 cm or less, and more preferably has dimensions of approximately 3 cm (height)×4 cm (width)×5 cm (length), where the length is taken along the propagation direction of the laser beam. Further to achieve the desired small size and portability, the output lens and the filter lens each have a relatively small diameter. In preferred embodiments, the diameter of the output lens and the filter lens are each 10 mm or less, and in a most preferred embodiment, the diameter of the output lens and the filter lens are each approximately equal to 5 mm or less.

Other embodiments of the invention employ additionally an electronic subassembly incorporated into the housing. The electronic subassembly has a switch and a summing node, contained within the housing. The MIR laser device also has an input RF port for inputting an RF modulating signal into the electronic subassembly through an impedance matching circuit, and a drive current input terminal electrically connected to the quantum cascade laser gain medium for inputting drive current to the quantum cascade laser gain medium. There is further provided a switching control signal input terminal for inputting a switching control signal into the electrical subassembly of the housing for switching the switch between a first and second state. The first state of the switch passes the drive current to the quantum cascade laser gain medium permitting it to operate (on position of the quantum cascade laser gain medium) and the second state of the switch shunts the drive current to ground thus preventing the drive current from reaching the quantum cascade laser gain medium thereby ceasing operation of the quantum cascade laser gain medium (turn it off). Controlling the amount of on time to the amount of off time of the laser causes the laser to operate in pulse mode, oscillating between the on and off states at regular intervals according to a duty cycle defined by the time of the on/off states. This duty cycle control of a laser is well known to those skilled in the art and may be used to control the laser to operate in pulsed mode or, in the extreme case, maintaining the laser on all the time results in cw operation of the laser.

The summing node of the electronic subassembly is interposed in an electrical path between the drive current input terminal and the quantum cascade laser gain medium to add the RF modulating signal which is input at the RF input port to the laser drive current. RF modulation, also known as frequency modulation, is well known in absorption spectroscopy and is used to increase the sensitivity of a detecting system which detects the laser beam after it has passed through a sample gas of interest. The absorption dip due to absorption of the particular molecules of interest in the sample gas traversed by the laser beam is much easier to detect when the laser beam has been frequency modulated.

In accordance with other embodiments of the invention, there is provided a MIR laser device having a housing; a quantum cascade laser gain medium contained within the housing; an output lens contained within the housing and mounted for collimating laser light output from the quantum cascade laser gain medium, a filter and a filter lens for collimating laser light from the quantum cascade laser gain medium and directing same toward the filter. In order to achieve the small sizes needed for facile portability and ease of use, the optical lens is chosen to be quite small and has a diameter of approximately 10 mm or less. The output lens is positioned a distance away from the quantum cascade laser equal to its focal length so that the output lens serves to collimate the laser light from the quantum cascade laser gain medium and direct a parallel laser beam toward the exterior of the housing. Further, the filter lens is positioned a distance away from the quantum cascade laser gain medium equal to its focal length so that the filter lens serves to collimate the laser light from the quantum cascade laser gain medium and direct a parallel laser beam toward filter positioned in the external cavity. The housing is preferably hermetically sealed (to keep out moisture) and provided with an output window through which the collimated laser beam from the output lens is passed to the exterior of the housing. In other preferred embodiments, the diameter of the output lens and the filter lens are each chosen to be 5 mm or less.

The electronic subassembly described above, with its RF modulation and switch for controlling the duty cycle of operation, may also be used in connection with the small lens diameter embodiment described immediately above.

In accordance with yet other embodiments of the invention, there is provided a MIR laser device having a housing; a quantum cascade laser gain medium contained within the housing; and an output lens contained within the housing and mounted for collimating light output from the quantum cascade laser gain medium and directing the laser light outside of the housing. There is further provided an external cavity contained within the housing. The external cavity includes the quantum cascade laser gain medium and further includes a filter and a filter lens. The filter is operative for selecting one of a plurality of wavelengths and feeding back to the quantum cascade laser gain medium the selected wavelength for stimulating laser production in the quantum cascade laser gain medium. The filter lens is used for collimating light output from the quantum cascade laser gain medium and for directing the collimated light to the filter In order to achieve the small sizes needed for facile portability and ease of use, the components within the housing are designed to be quite small and the housing is chosen to be small and has a size of approximately 20 cm×20 cm×20 cm or less. The housing is preferably hermetically sealed (to keep out moisture) and provided with an output window through which the collimated laser beam is passed to the exterior of the housing. In other preferred embodiments, the size of the housing is approximately 3 cm×4 cm×6 cm.

In accordance with still other embodiments of the invention, there is provided a tunable MIR laser device which has a hermetically sealed housing. The housing may be filled with an inert gas and is designed primarily to keep out moisture. The housing has a window which is transparent to the laser light so that the laser light may exit the window to the exterior of the housing. To permit ease of use and generally applicability of the laser device the housing is designed to have dimensions of approximately 20 cm (height)×20 cm (width)× 20 cm (length) or less, where the length is taken along a direction of propagation of the laser light. The tunable Mid-IR laser device further has a thermo electric cooling (TEC) device which is also fully contained within the housing and a heat spreader. The heat spreader is mounted within the housing and is thermally coupled to the TEC device. A quantum cascade laser gain medium is utilized as the preferred lasing medium. The quantum cascade laser gain medium is contained within the housing and is thermally coupled to the heat spreader. The heat spreader is positioned intermediate the TEC device and the quantum cascade laser gain medium. The heat spreader is used to distribute the relatively large amount of heat generated by the quantum cascade laser gain medium to the TEC device to effectively cool the quantum cascade laser gain medium to permit it to operate efficiently at a controlled temperature and for a relatively long useful life. The tunable MIR laser device also includes an output lens contained within the housing and secured at a position away from a laser emitting surface of the quantum cascade laser gain medium equal to a focal length of the output lens so as to collimate light output from the quantum cascade laser gain medium and direct the collimated laser beam to an exterior of the housing through the optical window. A filter, such as a grating, and a filter support, such as a grating support are also provided. The filter and filter support are contained within the housing, and the filter is operative for selecting one of a plurality of wavelengths from the quantum cascade laser gain medium and feeding back to the quantum cascade laser gain medium the selected wavelength so as to tune the quantum cascade laser gain medium. A filter lens is also provided and contained within the housing. If the filter is a grating, the filter lens is a grating lens. The filter lens may be similarly constructed and dimensioned as the output lens. The filter lens is secured at a position away from the laser emitting surface of the quantum cascade laser gain medium equal to a focal length of the filter lens so as to collimate light output from the quantum cascade laser gain medium and direct the collimated laser light to the filter. The output lens and the filter lens are each relatively small so as to fit within the housing and are chosen to have a diameter of approximately 10 mm or less. The output lens, the quantum cascade laser gain medium, the filter support and the filter lens are fixedly positioned with respect to one another. A rigid optical platform is utilized to fixedly secure these elements.

The external cavity tunable MIR laser device, in accordance with principles of embodiments of the invention, is very compact and light weight, and uses a quantum cascade laser gain medium as the laser gain medium. The quantum cascade laser gain medium may be selected for the particular application of interest within the frequency range of 3-12 µm by appropriate selection of the thickness of quantum wells and barriers and may be tuned over the frequency range of interest. Such a tunable compact, MIR laser enables a number of instruments to be developed in the fields of medical diagnostics, homeland security, and industrial processing, all based on laser absorption spectroscopy for molecular detection. Important characteristics of the tunable MIR device is the use of a quantum laser as the laser gain media, short focal length aspheric lens, for both the output lens and the filter lens (external cavity lens) enhanced cooling techniques that do not require liquid nitrogen and the use of high integration and packaging. The resulting structure presents a foot print that is extremely small with a package size (housing size) of approximately 20 cm (height)×20 cm (width)×20 cm (length) or less. The length is taken along the optical axis, which is the laser propagation direction. The packages size may be any integer or fraction thereof between approximately 1-20 cm for the length dimension combined with any integer or fraction thereof between approximately 1-20 cm in width dimension combined with any integer or fraction thereof between approximately 1-20 cm in the height dimension. A preferred footprint is approximately 3 cm (height)×4 cm (width)×6 cm (length) for the laser package, where the 6 cm is taken along the beam propagation direction.

Some advantages of the MIR device according to embodiments of the invention include high brightness with diffraction limited spatial properties and a narrow spectral width (<100 MHz=0.003 cm$^{-1}$). The quantum laser gain medium enables high output power (50 mW) and allows easy modulation at high frequency with very low chirp. The packaging technology is mechanically and environmentally robust with excellent thermal properties and provides for dramatic miniaturization.

In most conventional systems, cryogenic cooling has been required for MIR lasers. In contrast, the MIR laser device, in a preferred embodiment, can be temperature controlled close to room temperature without the need for bulky cryogenic cooling but rather employing thermo-electric coolers. Further, the MIR laser device in accordance with embodiments of the invention uses a packaging that specifically accommodates the designs associated with MIR photonics products with specific emphasis on thermal, optical and size requirements.

Further conventional drawbacks to a compact MIR laser device results from the high heat output of quantum cascade lasers—typically 10 W and even up to 15 W. This heat needs to be removed from the cavity efficiently to maintain cavity temperature and wavelength. This heat load typically requires a large heat sink to effectively remove the heat. In the MIR laser device according to embodiments of the invention, a high conductivity, heat-spreader is used and serves as a small but efficient transfer device to transfer the heat to a thermo-electric cooler.

An additional impediment to a compact MIR laser design is the conventional use of relatively large size lenses associated with MIR radiation. Typically, these lenses are >10-15 mm in diameter and often 25 mm or more. In contrast, the MIR laser device, in accordance with embodiments of the invention, uses a small aspheric lenses (approximately equal to or less than 5 mm D) that can be used in conjunction with the quantum cascade laser.

BRIEF DESCRIPTION OF THE DRAWINGS

FIGS. 2A and 2B show exploded perspective view of the MIR laser device with FIG. 2B being rotated so show a back side of the laser device relative to FIG. 2A;

FIG. 3 shows a plan view of the MIR laser device with the top or lid removed to show the internal structure;

FIG. 4A shows a cross sectional view of the MIR laser device taken along lines A-A of FIG. 3;

FIG. 4B shows an enlarged view of a portion of FIG. 4A;

FIGS. 7A and 7B show exploded perspective view of the MIR laser device of FIG. 6, with FIG. 7B being rotated so show a back side of the laser device relative to FIG. 7A;

FIG. 8 shows a plan view of the MIR laser device of FIG. 6 with the top or lid removed to show the internal structure;

FIG. 9A shows a cross sectional view of the MIR laser device taken along lines A-A of FIG. 8;

FIG. 9B shows an enlarged view of a portion of FIG. 9A;

DETAILED DESCRIPTION OF THE PREFERRED EMBODIMENTS

Figure 1A:
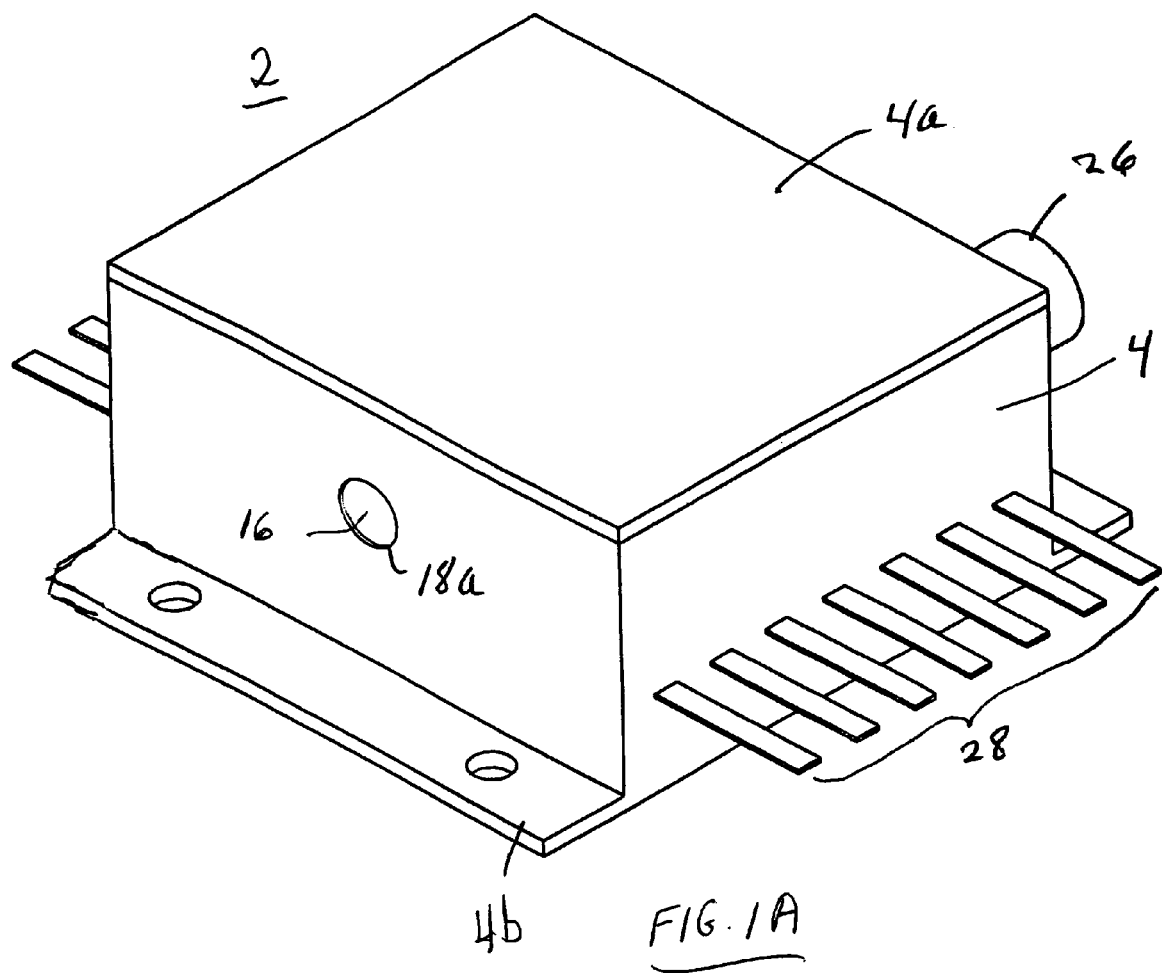
FIGS. 1A-1C show perspective views of a fixed wavelength MIR laser device.
Figure 1B:
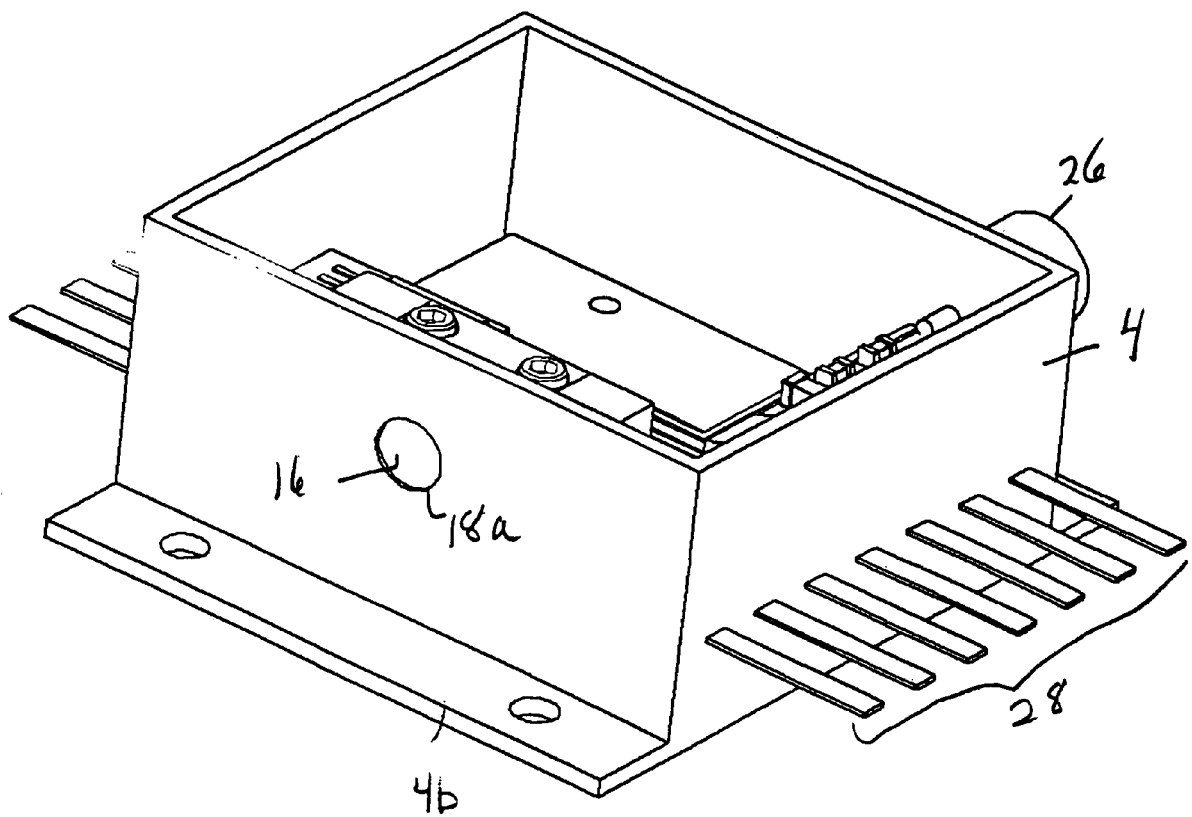
Figure 1C:
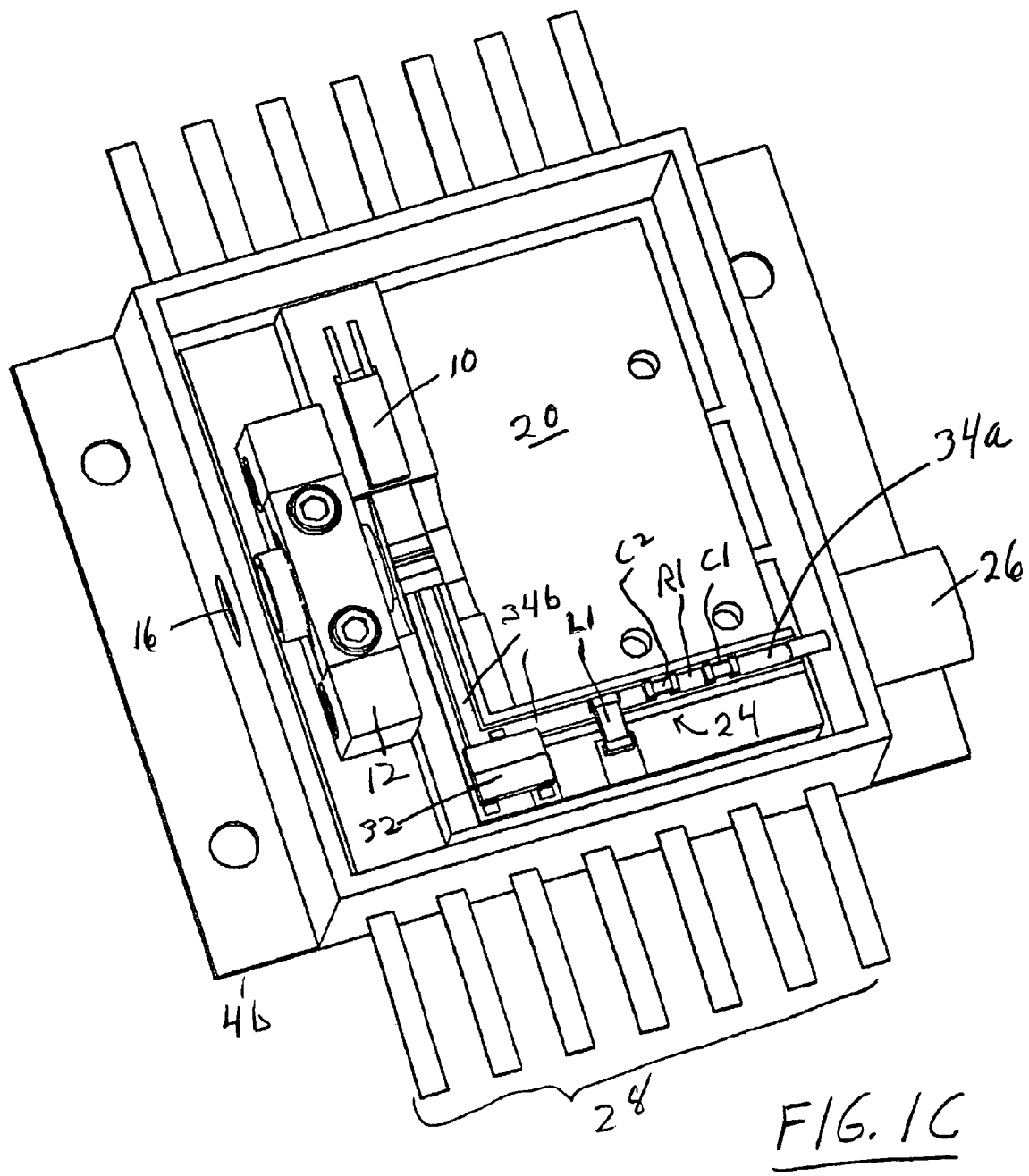
Figure 5:
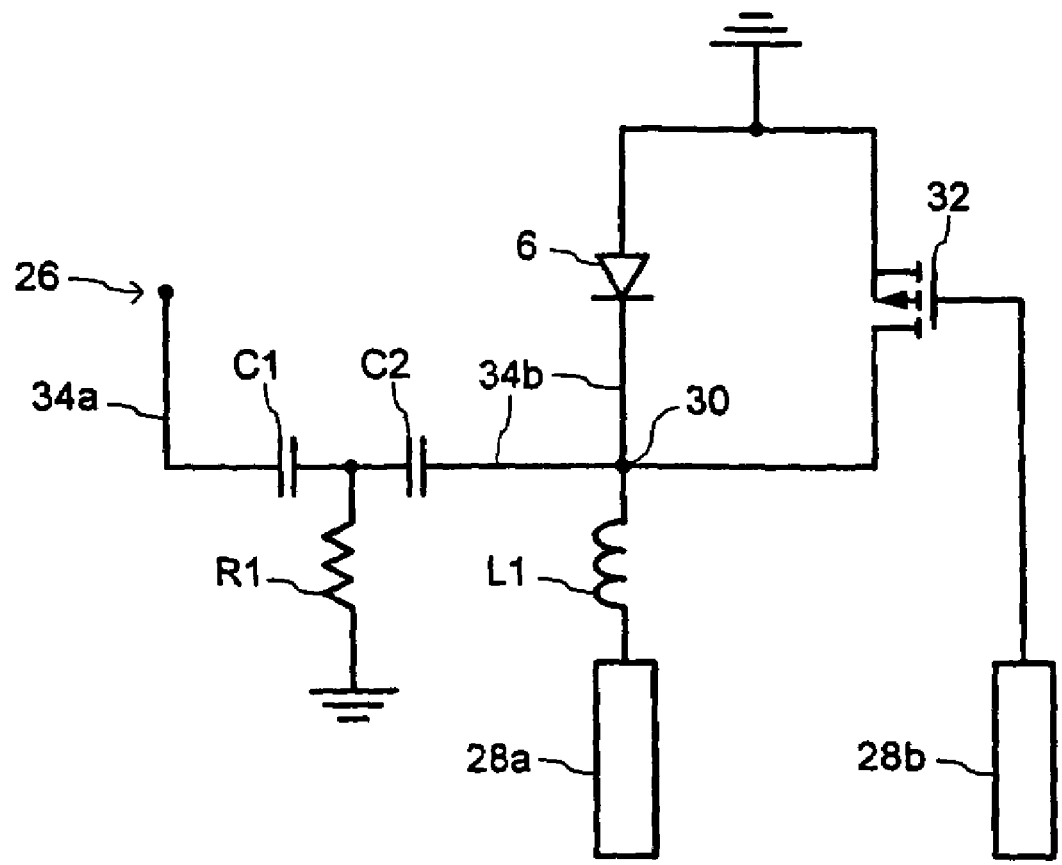
FIG. 5 shows a schematic diagram of the electronics sub-assembly of the laser device.

Embodiments of the invention expand upon the basic description of the MIR laser set forth above and forming part of the above referenced co-pending application which is incorporated herein in its entirety by reference. Common elements are identified by the same reference numeral throughout. The laser gain medium 6 utilized in FIGS. 1-5 is now replaced with a quantum cascade laser gain medium 6a which has an anti-reflective coating on the side of the laser chip facing the external cavity so that the wavelength dependent filter of the external cavity now serves as the fully or partially reflecting mirror for the laser.

Figure 6:
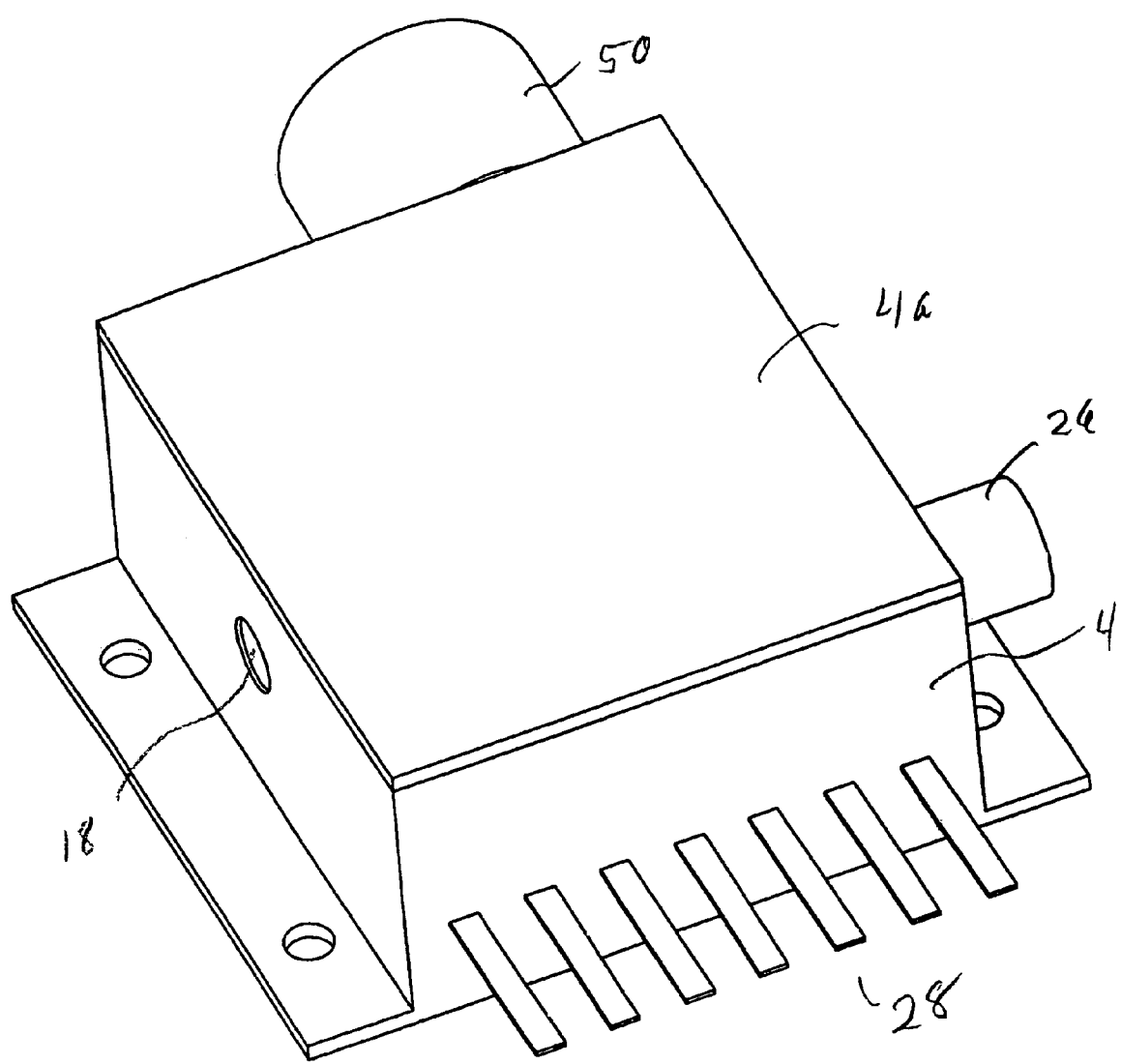
FIGS. 6 shows perspective views of the tunable external cavity MIR laser device according to a first embodiment of the invention.

Embodiments of the invention may be seen in FIGS. 6-9. FIG. 6 shows a perspective view of the MIR laser 2, and FIGS. 7A and 7B show exploded perspective views similar to that of FIGS. 2A and 2B. FIG. 8 shows a plan view of an assembled external cavity tunable MIR laser with the top cover plate 4a removed to reveal the interior. FIG. 9A shows a cross section of FIG. 8 taken along line A-A of FIG. 8. FIG. 9B shows an enlarged view of the laser gain medium and the optional high thermal conductivity submount 8 of FIG. 9A.

The housing dimensions of the external cavity tuned laser is preferably 20 cm (height)×20 cm (width)×20 cm (length) or less, were the length is taken along the beam propagation direction. The housing is most preferably approximately equal to 3 cm (height)×4 cm (width)×6 cm (length) or less where again the length is taken along the beam propagation direction.

In addition to the elements previously described in connection with the fixed wavelength MIR laser device, FIGS. 6-9 are seen to include the use of an external cavity 40. The external cavity 40 includes the quantum cascade laser gain medium 6a, a grating lens 42, grating lens mount 44, grating lens holder 45, grating 46 and grating sub-assembly 48. The grating lens 42 may sometimes be referred to as a cavity lens. Additionally, a motor 50 is provided outside the housing 4. The motor 50 has an encoder (not separately shown) and a cylinder 52 used to position the motor when mounting it to the housing 4. A motor shaft 54 passes through shaft housing aperture 60 and connects to a shaft 48a of the pivot sub-assembly 48 via a shaft coupler 56 to pivot the grating 46 at the desired angle for tuning the output frequency of the laser. The grating 46 is held in a cradle 48b (as for example by means of glue or solder) which is a C-shaped structure surrounding the grating 46 on two side surfaces and a back surface. The shaft 48a passes through an end support walls 58a of the pivot sub-assembly and fixedly connects to one side of the cradle 48b. The other side of the cradle 48b is fixed to a short shaft 48c (see FIG. 8) that connects this other side of cradle 48b to the opposite end support walls 58b. This short shaft 48c is free to rotate within the end support walls 58b. In this manner, rotation of the motor shaft 54 rotates the shaft 48a which in turn causes the cradle 48b to rotate which in turn rotates the grating 46. The motor encoder provides outputs signals indicative of the amount of rotation of the motor shaft 54 and consequently the grating 46.

The housing itself is hermetically sealed. For this purpose, by way of example and not by way of limitation, an elastomeric seal may be provided around the motor flange 50a for securing the motor 50 to the housing 4 in an air tight arrangement. In this manner, it is not necessary to have an air tight rotary seal at the point of penetration of the housing 4 by the shaft 54. A soft solder attachment of the motor flange 50a may alternatively be used.

The grating lens 42 may be identical in composition and size to the output lens 14. The grating lens 42 serves to collimate the laser output from the quantum cascade laser gain medium 6a (preferably a quantum cascade laser) and for that purpose is positioned a distance away from the emitting surface of the quantum cascade laser gain medium 6a by an amount equal to its focal length. The diameters of the grating lens 42 and output lens 14 are preferably each less than 10 mm and most preferably less than 5 mm and may have a diameter any integral or fractional amount less than 10 mm and preferably less than 5 mm. It is also possible, of course, that the grating lens 42 is not identical in every respect to the output lens 14. For example, the output lens 14 may have a diameter of 7.2 mm and the grating lens may have a diameter of 5.5 mm or visa versa. The composition of the two lens may also differ, but each is preferably selected from the materials set forth above in connection with the description of the fixed wavelength MIR, the description being incorporated herein by reference.

Figure 7B:
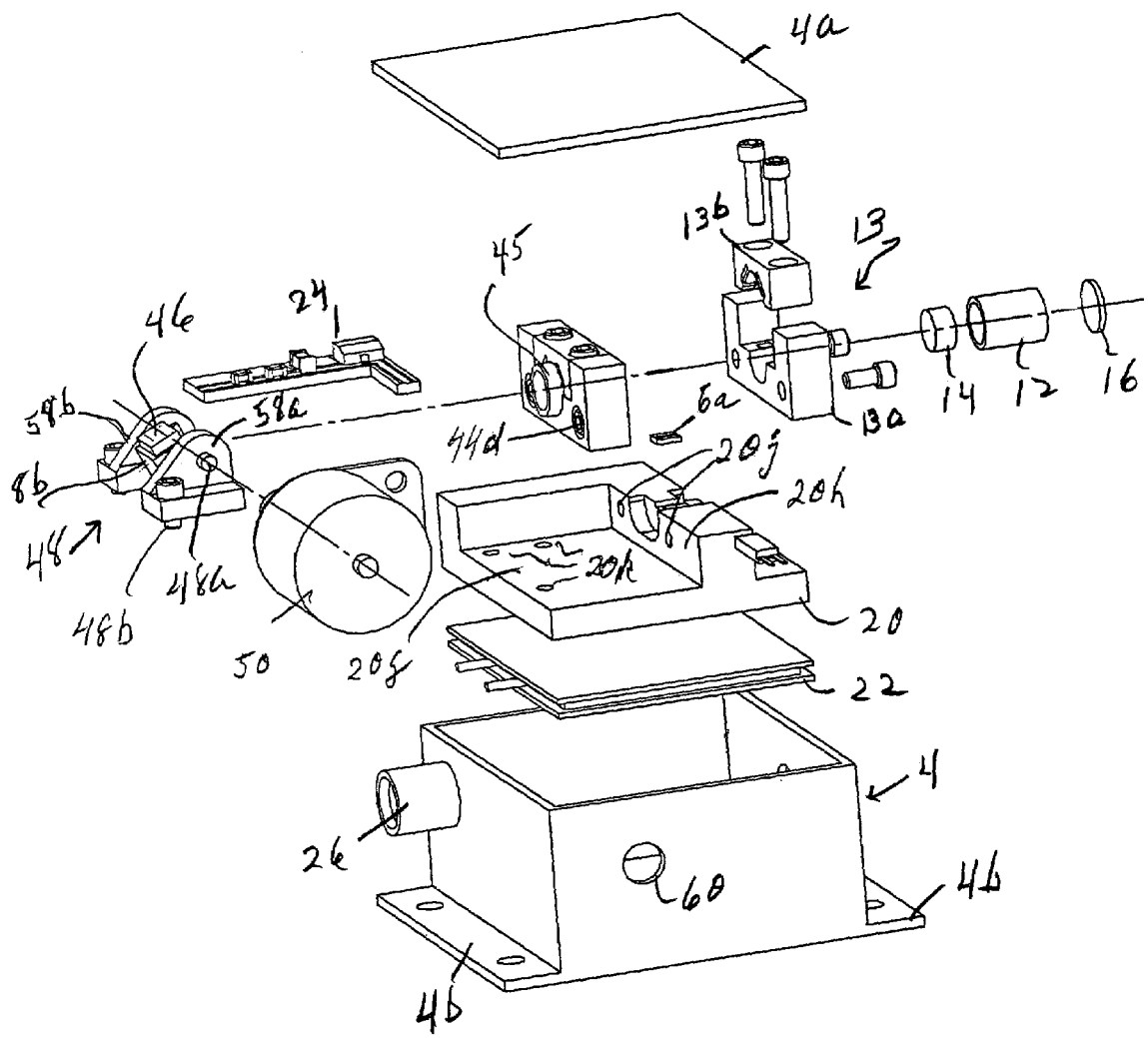

The grating lens mount 44 used for securing grating lens 42 is implemented in the same fashion as the output lens mount 13 used for securing output lens 14. FIGS. 7A and 7B show exploded views of the output lens mount 13, and assembled views of the grating lens mount 44. However, is should be understood that an exploded view of the grating lens mount 44 would be the same as the exploded view of the output lens mount 13 except that the front and back surfaces of the respective U-shaped supports are reversed so that the back surfaces of the output lens mount 13 and the back surface of the grating lens mount 44 each make contact with the optics platform 20. Thus, the grating lens mount 44 includes a U-shaped support 44a, retention cap 44b, top screws 44c, front screws 44d, and spring fingers 44e and grating lens mount 45. These elements cooperate to secure the grating lens 42 to the grating lens mount 44. The front screws 44d, have threaded end portions 44f (see FIG. 7A) that screw into threaded holes 20j of back surface 20h (see FIG. 7B) of the heat spreader/optical platform 20. The screws 44d thus secure the grating lens mount 44 to the heat spreader/optical platform 20 in the same fashion as the screws 13d secure the output lens mount 13 to the heat spreader/optical platform 20.

The encoder of the motor 50 provides position (or rotation) signals indicative of the amount of rotation of the motor shaft 54. The shaft 54 of motor 50 is coupled to a shaft 48a of the pivot sub-assembly 48 via the shaft coupler 56. The shaft 48a of the pivot sub-assembly 48 passes through end support wall 58a of pivot sub-assembly such that the pivot axis of the grating is located at the center of the diffracting surface of the grating 46. In other words, the axis of rotation of the shaft 48a (as well as motor shaft 54) passes through the center of the diffracting surface of the grating 46 as shown by the cross hairs in FIG. 9A. Alternatively, to prevent mode hops, the grating could be rotated about a pivot axis not through the center of the diffraction surface. Rotation of the shaft 54 rotates the grating diffracting surface relative to the incident laser beam thus effectively changing the angle of incidence of the laser beam onto the grating 46. Changing the incidence angle serves to preferentially select a single wavelength which is the first order diffracted light from the grating surface. This light is diffracted back onto the same path as the incident beam to thereby tune the laser to the grating first order diffracted wavelength as is well know to those of skill in the art. The diffracted laser light is received by the quantum cascade laser medium 6a to provide stimulated laser emission thereby resonating the laser gain medium with the grating selected wavelength.

The pivot sub-assembly 48 is mounted fixedly to the heat spreader/optical platform 20 by means of three screws 48d which have threaded end portions received in threaded holes 20k on the surface 20g of the heat spreader/optical platform 20. The pivot sub-assembly 48 serves as a grating support which itself is fixed to the heat spreader/optical platform 20 but also permits rotation of the grating 46 about its rotation axis. Thus, all of the critical optical components, namely, the output lens 14, the grating lens 42 and the grating sub-assembly 48 are each rigidly and fixedly secured to the same optical platform 20. The optical platform 20 is preferably an integrally constructed, rigid one piece structure and serves to secure the critical optical elements together in a fixed relationship to one another.

It may be seen that the output lens 14 and the grating lens 42 have their optical axis coincident and that the diffracting surface of the grating 46 intersects this optical axis as well. The laser gain medium 6a is positioned at the focal point of both the output lens 14 and the grating lens 42 and the laser emitting surface thereof is coincident with the optical axis of the output lens 14 and grating lens 42.

The configuration of the external cavity 40 components shown in FIGS. 6-9 corresponds to a Littrow external cavity structure with a double ended laser gain medium. The laser gain medium is preferably a quantum cascade laser, and the term double ended refers to the fact that the laser gain medium is an edge emitting laser where the lasing takes place in the plane of the active region and is output at both end facets of the semiconductor material forming the laser.

Figure 10:
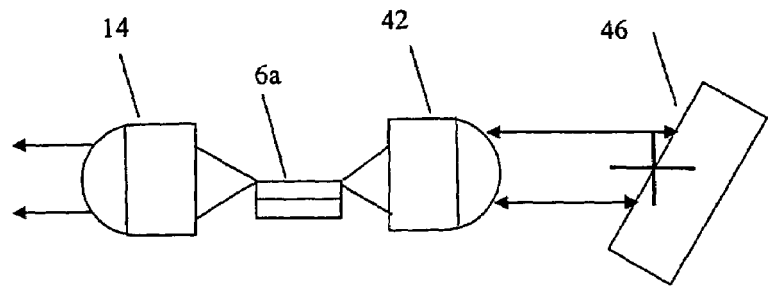
FIG. 10 is a schematic illustration of elements of the first embodiment of the invention showing a Littrow cavity with a double ended gain medium.

A simplified drawing of the basic Littrow external cavity arrangement is shown in FIG. 10. The laser gain medium (taken the form of an edge emitting laser) is seen to emit laser light in the direction of the output lens 14 as well as in the direction of the grating lens 42. First order diffracted light is diffracted from the grating back onto the incident beam to serve as feedback. The $0^{th}$ order diffracted light is not utilized. However, in other embodiments of the invention, the $0^{th}$ order diffracted light may be directed out of an additional aperture (not shown) of the housing (through a hermetically sealed window) and may serve as an optional auxiliary output beam. This auxiliary beam may be used for monitoring laser performance: power or wavelength for example.

Figure 11:
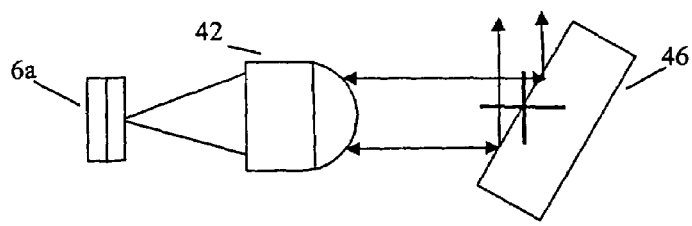
FIG. 11 is a schematic illustration of elements of a second embodiment of the invention showing a Littrow cavity with a single ended gain medium.
Figure 12:
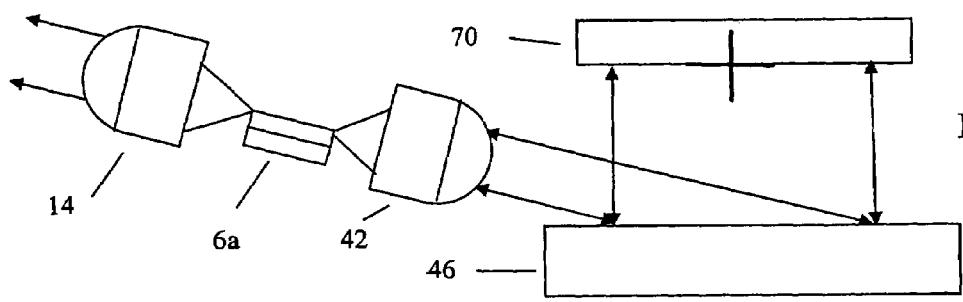
FIG. 12 is a schematic illustration of the optical elements of a third embodiment showing a Littman cavity with a double ended gain medium.
Figure 13:
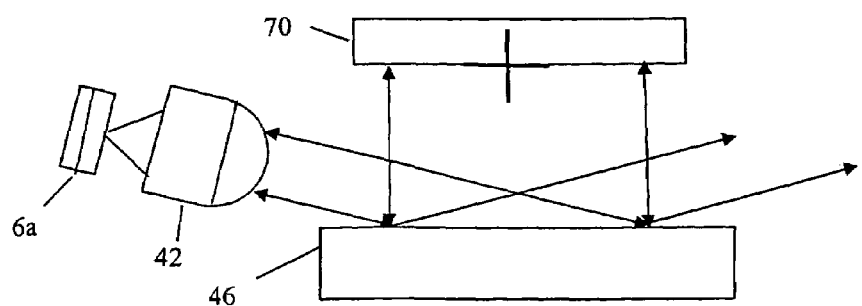
FIG. 13 is a schematic illustration of the optical elements of a fourth embodiment showing a Littman cavity with a single ended gain medium.

The wavelength control discussed above utilizes grating 46 either alone (FIGS. 10 and 11) or with a reflector 70 (FIGS. 12 and 13). However, more generally a filter may be used for the same purpose. In general, the wavelength of the tunable excitation source is controlled by moving a filter such which may take the form of, for example, a grating, etalon, prism, birefringent filter or interference filter. The actuator that moves the filter is driven in response to input from an angle sensor from the encoder operative to provide output signals indicative of the amount of rotation of the filter (e.g., grating or mirror for example). A controller receives these encoder signals and uses them as a measure of rotation to stop the motor so that a desired rotation angle is achieved.

FIG. 11 shows a simplified diagram of the external laser cavity similar to that of FIG. 10, but utilize a single ended quantum cascade laser (vertical cavity surface emitting laser) as the laser gain medium 6a. In this arrangement, the $0^{th}$ order diffracted beam is used as the output beam. In this embodiment, the previously described output lens 14 is not used; rather the $0^{th}$ order beam is used directly as the output beam. Tuning of the laser gain medium is again achieved by rotation of the grating 46.

FIG. 12 shows a simplified diagram of the external cavity similar to that of FIG. 10 using a double ended laser gain medium (edge emitting) but this time using a Littman cavity arrangement. The grating angle is here set at a relatively large angle (relative to the Littrow arrangement) and may, for example, be set between approximately 60-90 degrees from normal, more preferably between 75-90 degrees and most preferably between 80-90 degrees. An angle of approximately 85 degrees from normal is optimal.

FIG. 13 shows a similar Littman cavity arrangement used with a single ended laser gain medium. The Littman cavity arrangement is characterized by utilizing a reflector 70 to pass the $1^{st}$ order diffracted beam twice through the grating 46 in a feedback path to the laser gain medium 6a. In the Littman cavity arrangements of FIGS. 12 and 13, the grating 46 is fixed and the reflector 70 is rotated to tune the laser gain medium. For this purpose, the motor shaft 54 is coupled a pivot shaft (not shown) of the reflector 70 for rotating the reflector to provide the desired tuning. The reflectors in the embodiments of FIGS. 12 and 13 are supported on a reflector support similar to the pivot sub-assembly 48 wherein the reflector support is fixedly secured to the optical platform 20 and yet provides rotational support for the reflector about a pivot axis marked by the cross hairs shown in FIGS. 12 and 13. For the single ended Littman cavity arrangement of FIG. 13, the output lens 14 is omitted and the output laser beam is taken from the $0^{th}$ order diffracted beam from the grating.

The Littrow and Littman cavity arrangements described herein employ an "external" cavity. The term "external" is used to indicated that the grating is placed outside of the laser gain medium as opposed to distributed lasers in which the grating in integrated within the semiconductor laser medium itself. The external cavity generally is defined to include the laser gain medium as well as the grating (and reflector if used) and grating lens. Thus, the external cavity is contained within the housing 4 as in not external to the housing.

As may be seen from the above figures, the quantum cascade laser gain medium 6a and high thermal conductivity sub-mount 8 are all rigidly mounted on the heat spreader/optical platform 20 which in turn is rigidly mounted on the cooler 22. The cooler 22 is rigidly fixed to the bottom of the housing 4. Further, elements of the external cavity are secured in a fixed position relative to the laser gain medium 6a. Thus, the cavity lens 42, grating 46 and, in the case of the Littman cavity arrangement, reflector 70 are all fixed in position on the same supporting substrate as the laser gain medium 6a. This supporting substrate is the heat spreader/optical platform 20. Further, the output lens 14 is also fixed to the heart spreader/optical platform 20. It is understood that in the Littman cavity arrangement, the reflector of course rotates about its' pivot axis and in the Littrow cavity arrangement, the grating likewise rotates about its' pivot axis. Thus, fixing of the reflector and grating means fixing the position of the pivot point relative to the other optical elements in the device 2, but does not, of course mean preventing the necessary rotation used for tuning.

The electronic subassembly 24 utilized in the fixed wavelength MIR laser may also be used in the tunable external cavity MIR laser in accordance with embodiments, and thus, the description thereof will not be repeated here for brevity.

While the motor 50 (with its encoder) are illustrated as being positioned outside of the housing 4, in other embodiments, the motor may be positioned inside of the housing. For this purpose, the motor 50 may take the form of a small linear or rotary voice coil actuator. Small rotary voice coil actuators may be used such as those popular on small size (e.g., 0.5 inch) magnetic disk used in MP3 players and the like, e.g., the Apple® iPod® and the Rio® (Carbon. A suitable manufacture of small linear voice coil motors include H2W Technologies, Inc. in Valencia Calif.

Figure 14:
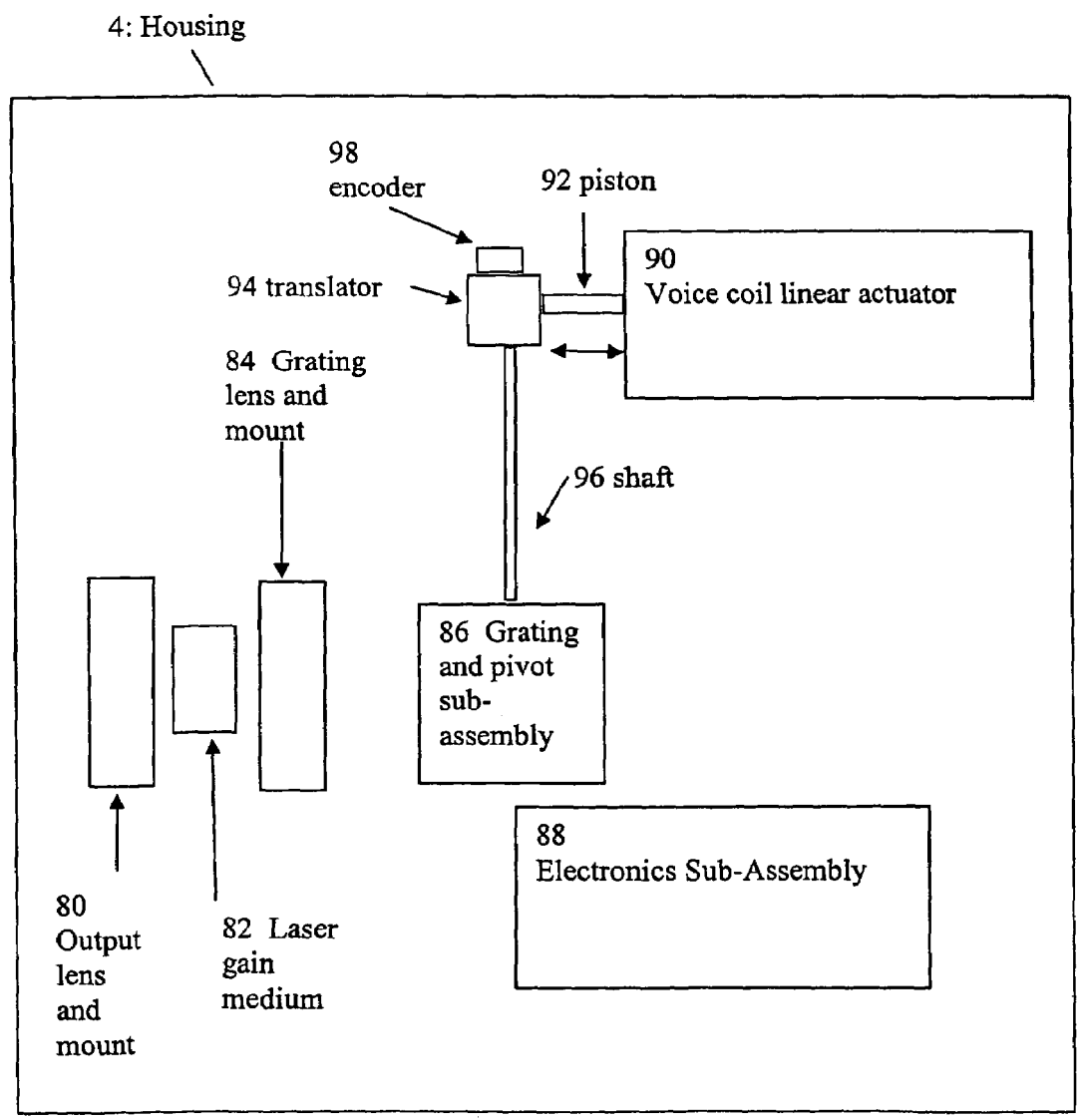
FIG. 14 is a block diagram showing a fifth embodiment of the invention with the grating control motor internal to the laser housing.

Such an internal motor configuration is illustrated schematically in FIG. 14. In this diagram, the previously described components are shown in block diagram and include output lens and mount 80 (corresponding to elements 12, 13, 14), laser gain medium 82 (corresponding to elements 6a and possibly 8 where utilized), grating lens and mount 84 (corresponding to elements 42 and 44), grating pivot sub-assembly 86 (corresponding to elements 46 and 48) and electronics sub-assembly 88 (corresponding to element 24). There is further illustrated a linear voice coil actuator 90 which drives a piston 92. The linear movement of the piston 92 is translated into rotational movement by means of linear-to-rotational translator 94 which provides rotational movement to the shaft 96. The linear-to-rotational translator 94 may be implement as a crank and slider well know to those of skill in the art. Shaft 96 is in turn coupled to the grating of the grating and pivot subassembly 86 for rotation thereof. An encoder 98, coupled to the shaft 96, provides an output signal indicative of the amount of rotation of the shaft 96. In this manner, the housing 4 may include the motor or actuator which is coupled to rotate the grating.

In the above described systems, signals from the motor encoder are fed to a controller (not shown) which is located external to the housing. The encoder signals are used to provide an indication of the amount of rotation of the grating shaft and the controller uses these signals to stop the motor when the desired amount of rotation has been achieved. Typically, the grating angle will pass through a range of angles to provide the desired wavelength sweep. In the case of the linear actuators supplied by H2W, for example, the controller will typically include a programmable motion controller for closed loop position control. A DC linear servo amplifier is also utilized to provide power to the linear actuator.

A controller is also provided external to the housing for controlling the cooler 22 based on input signals from the temperature sensor 10. For convenience, the cooler controller, the motor controller and control of the duty cycle of the quantum cascade laser drive current may be integrated into a single programmable controller or suitably programmed microprocessor.

While FIG. 14 represents a Littrow cavity arrangement such as shown in FIG. 10, it is clear that the external cavity arrangements similar to those shown in FIGS. 11-13 may also be utilized with the motor or actuator located internal to the housing 4.

While the invention has been describe in reference to preferred embodiments it will be understood that variations and improvements may be realized by those of skill in the art and the invention is intended to cover all such modifications that fall within the scope of the appended claims.

What is claimed is:

1. A tunable mid-IR (MIR) laser device comprising:
a housing;
a thermo electric cooling (TEC) device contained within said housing;
a heat spreader mounted within said housing above a surface of said TEC;
a quantum cascade laser gain medium contained within said housing and fixedly coupled to said heat spreader;
an output optical lens contained within said housing and fixedly mounted to said heat spreader for collimating light output from said quantum cascade laser gain medium to an exterior of said housing;
a filter having a filter support fixedly mounted to said heat spreader, said filter operative in the 3-12 μm range for selecting one of a plurality of wavelengths that are spaced by at least 0.75 Gigahertz, the spacing being commensurate with the filter being spaced apart from the quantum cascade laser gain medium a distance of less than twenty centimeters, and the filter feeding back to said quantum cascade laser gain medium said selected wavelength; and
a filter lens fixedly mounted to said heat spreader for collimating light output from said quantum cascade laser gain medium to said filter;
said heat spreader serving to distribute heat to said TEC and also serving as an optical platform to fixedly position said quantum cascade laser gain medium and said output optical lens, said filter lens and said filter relative to one another.

2. The tunable MIR laser device as recited in claim 1 wherein said housing has dimensions of approximately 20 cm×20 cm×20 cm or less.

3. The tunable MIR laser device as recited in claim 1 wherein said housing has dimensions of approximately 3 cm (height)×4 cm (width)×6 cm (length) where the length is taken along a direction of beam propagation.

4. The tunable MIR laser device as recited in claim 1 wherein said optical lens and said filter lens each have a diameter of approximately 10 mm or less.

5. The tunable MIR laser device as recited in claim 2 wherein said optical lens and said filter lens each have a diameter of approximately 10 mm or less.

6. The tunable MIR laser device as recited in claim 3 wherein said optical lens and said filter lens each have a diameter of approximately 10 mm or less.

7. The tunable MIR laser device as recited in claim 1 wherein said optical lens and said filter lens each have a diameter of approximately 5 mm or less.

8. The tunable MIR laser device as recited in claim 1 wherein said heat spreader have a thermal conductivity approximately 150-400 W/mK.

9. The tunable MIR laser device as recited in claim 1 wherein said heat spreader comprises one of Cu or CuW.

10. The tunable MIR laser device as recited in claim 1 further comprising a high thermal conductivity sub-mount interposed between said quantum cascade laser gain medium and said heat spreader, said sub-mount comprising at least diamond.

11. The tunable MIR laser device as recited in claim 1 further comprising a high thermal conductivity sub-mount interposed between said quantum cascade laser gain medium and said substrate said high thermal conductivity sub-mount having a thermal conductivity of approximately 500-2000 W/mK.

12. The tunable MIR laser device as recited in claim 1 wherein said filter comprises a grating, and said filter support comprising a grating support, said grating support fixedly mounted to said heat spreader and permitting rotation of said grating about a rotation axis, said grating rotation effective for selecting of said one of said plurality of wavelengths.

13. The tunable MIR laser device as recited in claim 1 further comprising an electronics sub-assembly comprising:
a switch contained within said housing;
an summing node, contained within said housing;
an RF input port for inputting an RF modulating signal;
a drive current input terminal electrically connected to said quantum cascade laser gain medium for inputting drive current to said quantum cascade laser gain medium;
a switching control signal input terminal for inputting a switching control signal for switching said switch between a first and second state;
said switch electrically connected to said quantum cascade laser gain medium and operative in a first state to turn said quantum cascade laser gain medium on and in a second state operative to turn said quantum cascade laser gain medium off;
said summing node interposed in an electrical path between said drive current input terminal and said quantum cascade laser gain medium to add said RF modulating signal to said drive current.

14. A mid-IR (MIR) laser device comprising:
a housing;
a quantum cascade laser gain medium contained within the housing, the gain medium including a first facet and a second facet, the gain medium providing light that exits the first facet and the second facet;
an output optical lens contained within the housing, the output optical lens collimating the light that exits from the first facet of the gain medium;
a filter that is operative in the 3-12 μm range for selecting one of a plurality of wavelengths of light exiting from the second facet, the wavelengths being spaced apart by at least 0.75 Gigahertz, the spacing being commensurate with the filter being spaced apart from the quantum cascade laser gain medium a distance less than twenty centimeters, and the filter feeding back to the gain medium the selected wavelength;
a filter support that regains the filter;
a filter lens that collimates light output from the second facet of the gain medium to the filter; and
a heat spreader that fixedly retains the gain medium, the output optical lens, the filter support, and the filter lens, the heat spreader serving as a monolithic optical platform to fixedly position the gain medium, the output optical lens, the filter lens and the filter relative to one another.

15. The laser device of claim 14 further comprising a thermo electric cooling (TEC) device contained within the housing, the TEC being positioned adjacent the heat spreader, the heat spreader serving to distribute heat to the TEC.

16. The laser device of claim 14 wherein the filter is movable relative to the heat spreader for selecting one of the plurality of wavelengths.

17. The laser device of claim 16 wherein the filter is rotatable relative to the heat spreader for selecting one of the plurality of wavelengths.

18. The laser device of claim 17 further comprising a motor that selectively rotates the filter.

19. The laser device of claim 14 wherein the housing has dimensions of approximately 20 cm×20 cm×20 cm or less.

20. The laser device of claim 14 wherein the housing has dimensions of approximately 3 cm (height)×4 cm (width)×6 cm (length) where the length is taken along a direction of beam propagation.

21. The laser device of claim 14 wherein the optical lens and the filter lens each have a diameter of approximately 10 mm or less.

22. The laser device of claim 14 wherein the optical lens and the filter lens each have a diameter of approximately 5 mm or less.

23. The laser device of claim 14 wherein the heat spreader has a thermal conductivity approximately 150-400 W/mK.

24. The laser device of claim 14 further comprising a high thermal conductivity sub-mount interposed between the gain medium and the heat spreader, the high thermal conductivity sub-mount having a thermal conductivity of approximately 500-2000 W/mK.

25. The laser device of claim 14 wherein the second facet of the gain media includes an anti-reflective coating.

26. The laser device of claim 14 further comprising an electronics sub-assembly comprising: (i) a switch contained within the housing; (ii) an summing node, contained within the housing; (iii) an RF input port for inputting an RF modulating signal; (iv) a drive current input terminal electrically connected to the gain medium for inputting drive current to the gain medium; (v) a switching control signal input terminal for inputting a switching control signal for switching the switch between a first and second state; the switch being electrically connected to the gain medium and operative in a first state to turn the gain medium on, and in a second state operative to turn the gain medium off; the summing node interposed in an electrical path between the drive current input terminal and the gain medium to add the RF modulating signal to the drive current.

27. A mid-IR (MIR) laser device comprising:
a housing having dimensions of approximately 20 cm×20 cm×20 cm or less;
a thermo electric cooling (TEC) device contained within the housing;
a quantum cascade laser gain medium contained within the housing, the gain medium including a first facet and a second facet, the second facet being coated with an anti-reflective coating, the gain medium providing light in Mid-IR frequencies that exits the first facet and the second facet;
an output optical lens contained within the housing, the output optical lens collimating the light that exits from the first facet of the gain medium, the output optical lens having a diameter of approximately 10 mm or less;
a filter that is operative for selecting one of a plurality of wavelengths of light in the 3-12 μm range exiting from the second facet and feeding back to the gain medium the selected wavelength, the filter selecting one of the plurality of wavelengths that are spaced by at least 0.75 Gigahertz, the spacing being commensurate with the filter being spaced apart from the quantum cascade laser gain medium a distance of less than twenty centimeters, and the filter feeding back to the quantum cascade laser gain medium the selected wavelength;
a filter support that retains the filter, the filter support allowing for the movement of the filter relative to the gain media for selecting one of the plurality of wavelengths;
a filter lens that collimates light output from the second facet of the gain medium to the filter, the filter lens having a diameter of 10 mm or less; and
a heat spreader that fixedly retains the gain medium, the output optical lens, the filter support, and the filter lens, the heat spreader serving as an optical platform to fixedly position the gain medium, the output optical lens, the filter lens and the filter relative to one another; the heat spreader being positioned adjacent the TEC so that the heat spreader serves to distribute heat to the TEC, the heat spreader having a thermal conductivity between approximately 150-400 W/mK.

28. The laser device of claim 27 wherein the filter comprises a grating, and the filter support comprising a grating support, the filter support permitting rotation of the grating about a rotation axis, the grating rotation effective for selecting one of the plurality of wavelengths.

29. The laser device of claim 27 further comprising a high thermal conductivity sub-mount interposed between the gain medium and the heat spreader, the high thermal conductivity sub-mount having a thermal conductivity of approximately 500-2000 W/mK.

30. The laser device of claim 27 further comprising an electronics sub-assembly comprising: (i) a switch contained within the housing; (ii) an summing node, contained within the housing; (iii) an RF input port for inputting an RF modulating signal; (iv) a drive current input terminal electrically connected to the gain medium for inputting drive current to the gain medium; (v) a switching control signal input terminal for inputting a switching control signal for switching the switch between a first and second state; the switch being electrically connected to the gain medium and operative in a first state to turn the gain medium on, and in a second state operative to turn the gain medium off; the summing node interposed in an electrical path between the drive current input terminal and the gain medium to add the RF modulating signal to the drive current.

31. A tunable mid-IR (MIR) laser device comprising:
a housing;
a thermo electric cooling (TEC) device contained within said housing;
a heat spreader mounted within said housing above a surface of said TEC;

a quantum cascade laser gain medium contained within said housing and fixedly coupled to said heat spreader;

an output optical lens contained within said housing and fixedly mounted to said heat spreader for collimating light output from said quantum cascade laser gain medium to an exterior of said housing;

a filter having a filter support fixedly mounted to said heat spreader, said filter operative in the 3-12 μm range for selecting one of a plurality of wavelengths that are spaced by at least 0.75 Gigahertz, the spacing being commensurate with the filter being spaced apart from the quantum cascade laser gain medium a distance of less than twenty centimeters, and the filter feeding back to said quantum cascade laser gain medium said selected wavelength, the filter being movable relative to the heat spreader; and a filter lens fixedly mounted to said heat spreader for collimating light output from said quantum cascade laser gain medium to said filter;

said heat spreader serving to distribute heat to said TEC and also serving as an optical platform to fixedly position said quantum cascade laser gain medium and said output optical lens, said filter lens and said filter relative to one another.

32. The A tunable mid-IR (MIR) laser device of claim 14 wherein the filter is operative for selecting one of the plurality of wavelengths that are spaced by at least 0.75 Gigahertz, the spacing being commensurate with the filter being spaced apart from the quantum cascade laser gain medium a distance of less than twenty centimeters.

* * * * *